US012619019B2

(12) United States Patent
Hoshino et al.

(10) Patent No.: US 12,619,019 B2
(45) Date of Patent: May 5, 2026

(54) COMPOSITION FOR FORMING POLARIZER, POLARIZER, LAMINATE, AND IMAGE DISPLAY DEVICE

(71) Applicant: FUJIFILM Corporation, Tokyo (JP)

(72) Inventors: Wataru Hoshino, Kanagawa (JP); Atsuro Nomoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 134 days.

(21) Appl. No.: 17/702,303

(22) Filed: Mar. 23, 2022

(65) Prior Publication Data

US 2022/0213385 A1 Jul. 7, 2022

Related U.S. Application Data

(63) Continuation of application No. PCT/JP2020/031762, filed on Aug. 24, 2020.

(30) Foreign Application Priority Data

Sep. 27, 2019 (JP) ................................ 2019-177710

(51) Int. Cl.

*G02F 1/1333* (2006.01)
*C08F 22/20* (2006.01)
*C09K 19/38* (2006.01)
*C09K 19/56* (2006.01)
*C09K 19/60* (2006.01)
*G02B 5/30* (2006.01)
*H10K 59/80* (2023.01)

(52) U.S. Cl.

CPC ............ *G02B 5/3016* (2013.01); *C08F 22/20* (2013.01); *C09K 19/3857* (2013.01); *C09K 19/56* (2013.01); *C09K 19/601* (2013.01); *H10K 59/8791* (2023.02)

(58) Field of Classification Search

CPC .. C09K 19/3857; C09K 19/56; C09K 19/601; C09K 19/3497; C09K 19/3852; C09K 2019/0448; C09K 2019/0444; G02B 5/3016; G02F 1/1335

See application file for complete search history.

(56) References Cited

U.S. PATENT DOCUMENTS

| | | | | |
|---|---|---|---|---|
| 2007/0024970 | A1 | 2/2007 | Lub et al. | |
| 2013/0265529 | A1 | 10/2013 | Wakizaka et al. | |
| 2019/0071571 | A1 | 3/2019 | Takada et al. | |
| 2021/0108142 | A1* | 4/2021 | Endou | C09K 19/586 |
| 2022/0213385 | A1* | 7/2022 | Hoshino | C09K 19/56 |

FOREIGN PATENT DOCUMENTS

| | | | | |
|---|---|---|---|---|
| CN | 103364845 | A | 10/2013 | |
| JP | 2006-161051 | A | 6/2006 | |
| JP | 2007-510946 | A | 4/2007 | |
| JP | 2010-001368 | A | 1/2010 | |
| JP | 2013-033248 | A | 2/2013 | |
| JP | 2015-156032 | A | 8/2015 | |
| JP | 2016-166344 | A | 9/2016 | |
| KR | 20190094145 | A * | 8/2019 | G02F 1/1335 |
| WO | 2017/195833 | A1 | 11/2017 | |
| WO | 2018/003514 | A1 | 1/2018 | |
| WO | 2018/003515 | A1 | 1/2018 | |
| WO | 2018/110530 | A1 | 6/2018 | |
| WO | WO 2019/102922 | A1 * | 5/2019 | G02F 1/13 |

OTHER PUBLICATIONS

Machine Translation of WO 2019/102922 A1 (Year: 2024).*

Office Action, issued by the State Intellectual Property Office on Jun. 3, 2023, in connection with Chinese Patent Application No. 202080066407.8.

Office Action, issued by the Japanese Patent Office on Apr. 18, 2023, in connection with Japanese Patent Application No. 2021-548435.

Office Action, which was issued by the State Intellectual Property Office of China on Feb. 3, 2023, in connection with Chinese Patent Application No. CN 202080066407.8.

International Search Report issued in PCT/JP2020/031762 on Nov. 2, 2020.

Written Opinion issued in PCT/JP2020/031762 on Nov. 2, 2020.

International Preliminary Report on Patentability completed by WIPO on Mar. 15, 2022 in connection with International Patent Application No. PCT/JP2020/031762.

Office Action, issued by the Japanese Patent Office on Sep. 12, 2023, in connection with Japanese Patent Application No. 2021-548435.

Office Action, issued by the China National Intellectual Property Administration on Sep. 5, 2023, in connection with Chinese Patent Application No. 202080066407.8.

(Continued)

*Primary Examiner* — Geraldina Visconti

(74) *Attorney, Agent, or Firm* — Edwards Neils LLC; Jean C. Edwards, Esq.

(57) ABSTRACT

Provided is a composition for forming a polarizer from which a polarizer with an excellent surface state can be formed, a polarizer, a laminate, and an image display device. The composition for forming a polarizer includes a polymerizable liquid crystal compound which has two or more rings selected from the group consisting of an aromatic ring and an alicyclic ring and two polymerizable groups and exhibits a liquid crystal state of a smectic phase, a monofunctional polymerizable compound which has two or more rings selected from the group consisting of an aromatic ring and an alicyclic ring and one polymerizable group, and a dichroic material, in which the number of atoms NA of the polymerizable liquid crystal compound and the number of atoms NB of the monofunctional polymerizable compound satisfy Expression (1), $0.35 \leq NB/NA \leq 0.65$ (1).

8 Claims, No Drawings

(56) References Cited

OTHER PUBLICATIONS

Office Action issued by the Japanese Patent Office on Jul. 2, 2024, in connection with Japanese Patent Application No. 2023-205826.

* cited by examiner

COMPOSITION FOR FORMING POLARIZER, POLARIZER, LAMINATE, AND IMAGE DISPLAY DEVICE

CROSS-REFERENCE TO RELATED APPLICATIONS

This application is a Continuation of PCT International Application No. PCT/JP2020/031762 filed on Aug. 24, 2020, which was published under PCT Article 21(2) in Japanese, and which claims priority under 35 U.S.C. § 119(a) to Japanese Patent Application No. 2019-177710 filed on Sep. 27, 2019. The above applications are hereby expressly incorporated by reference, in their entirety, into the present application.

BACKGROUND OF THE INVENTION

1. Field of the Invention

The present invention relates to a composition for forming a polarizer, a polarizer, a laminate, and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products having the corresponding functions described above are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic dye in place of iodine as a dichroic material has also been examined.

For example, WO2017/195833A discloses a composition for forming a polarizer which contains a polymer liquid crystal compound and a dichroic material.

SUMMARY OF THE INVENTION

As a result of preparation of a polarizer based on WO2017/195833A, the present inventors found that there is room for improvement in the surface state of the polarizer.

Therefore, an object of the present invention is to provide a composition for forming a polarizer from which a polarizer with an excellent surface state can be formed, a polarizer, a laminate, and an image display device.

As a result of intensive research conducted by the present inventors in order to achieve the above-described object, it was found that the surface state of a polarizer to be formed is excellent in a case where a composition for forming a polarizer which contains a polymerizable liquid crystal compound exhibiting a liquid crystal state of a smectic phase, a monofunctional polymerizable compound, and a dichroic material satisfies Expression (1) described below, thereby completing the present invention.

That is, the present inventors found that the above-described problems can be solved by employing the following configurations.

[1] A composition for forming a polarizer comprising: a polymerizable liquid crystal compound which has two or more rings selected from the group consisting of an aromatic ring and an alicyclic ring and two polymerizable groups and exhibits a liquid crystal state of a smectic phase; a monofunctional polymerizable compound which has two or more rings selected from the group consisting of an aromatic ring and an alicyclic ring and one polymerizable group; and a dichroic material, in which the number of atoms NA of the polymerizable liquid crystal compound and the number of atoms NB of the monofunctional polymerizable compound satisfy Expression (1).

[2] The composition for forming a polarizer according to [1], in which the number of atoms NA of the polymerizable liquid crystal compound and the number of atoms NB of the monofunctional polymerizable compound satisfy Expression (2).

[3] The composition for forming a polarizer according to [1] or [2], in which the polymerizable liquid crystal compound is a compound represented by Formula (A-1).

[4] The composition for forming a polarizer according to any one of [1] to [3], in which the monofunctional polymerizable compound is a compound represented by Formula (B-1).

[5] The composition for forming a polarizer according to [3], in which the monofunctional polymerizable compound is a compound represented by Formula (B-1), arrangement of rings represented by Mb in Formula (B-1) and arranged between $X^3$ and Tb is the same as arrangement of rings represented by Ma in Formula (A-1) and arranged between $X^1$ and $X^2$.

[6] A polarizer which is formed of the composition for forming a polarizer according to any one of [1] to [5].

[7] A laminate comprising: a base material; an alignment film provided on the base material; and the polarizer according to [6], provided on the alignment film.

[8] An image display device comprising: the polarizer according to claim 6 or the laminate according to [7].

As described below, according to the present invention, it is possible to provide a composition for forming a polarizer capable of forming a polarizer with an excellent surface state. Further, according to the present invention, it is possible to provide a polarizer with an excellent surface state, and a laminate and an image display device which include the polarizer.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, parallel, orthogonal, horizontal, and vertical do not indicate parallel, orthogonal, horizontal, and vertical in a strict sense, but respectively indicate a range of parallel ±5°, a range of orthogonal ±5°, a range of horizontal ±5°, and a range of vertical ±5°.

Further, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

Further, in the present specification, "(meth)acrylate" is a notation representing "acrylate" or "methacrylate", "(meth) acryl" is a notation representing "acryl" or "methacryl", and "(meth)acryloyl" is a notation representing "acryloyl" or "methacryloyl".

[Composition for Forming a Polarizer]

A composition for forming a polarizer according to the embodiment of the present invention (hereinafter, also simply referred to as a "composition") contains a polymerizable liquid crystal compound (hereinafter, also referred to as a "smectic liquid crystal compound") which has two or more rings selected from the group consisting of an aromatic ring and an alicyclic ring and two polymerizable groups and exhibits a liquid crystal state of a smectic phase, a monofunctional polymerizable compound (hereinafter, also referred to as a "monofunctional compound") which has two or more rings selected from the group consisting of an aromatic ring and an alicyclic ring and one polymerizable group, and a dichroic material.

Further, in the smectic liquid crystal compound and the monofunctional compound contained in the composition according to the embodiment of the present invention, the number of atoms NA of the smectic liquid crystal compound and the number of atoms NB of the monofunctional compound satisfy Expression (1).

$$0.35 \leq NB/NA \leq 0.65 \quad (1)$$

Here, the number of atoms indicates the maximum numerical value in a case where the number of atoms on a bond connecting two atoms contained in each compound at the shortest distance is counted and does not include the number of hydrogen atoms.

Further, in a case of counting the number of atoms on the bond, the number of atoms that are present on the starting point and the ending point is also be counted.

For example, in the following compound A1 which is an example of the smectic liquid crystal compound, the number of atoms NA is the total number of atoms that are circled and is "56".

The same applies to the number of atoms NB of the monofunctional compound, and the number of atoms NB of the following compound B1 which is an example of the monofunctional compound is the total number of atoms that are circled and is "30".

A1

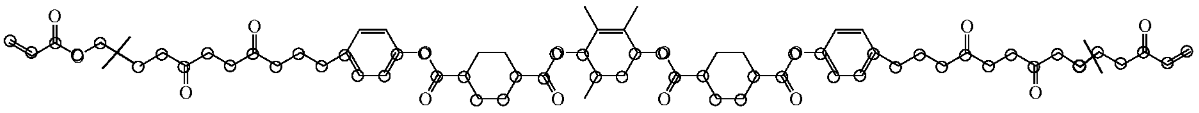

B1

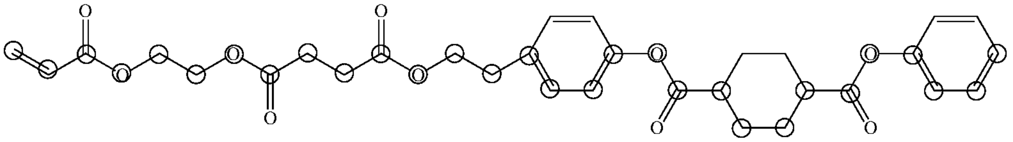

In the present invention, as described above, the surface state of a polarizer to be formed is satisfactory in a case where a composition containing a smectic liquid crystal compound and a monofunctional compound, in which the number of atoms NA and the number of atoms NB satisfy Expression (1) is used.

The details of the reason for this are not clear, but it is assumed as follows.

That is, in a case where the relationship of Expression (1) is satisfied, since the monofunctional compound is likely to enter and stay between the molecules of the smectic liquid crystal compound that is smectically aligned, the crystallization of the smectic liquid crystal compound can be suppressed during fixation of a smectic phase in a liquid crystal state, and thus the surface state of the polarizer to be formed is considered to be satisfactory.

In the smectic liquid crystal compound and the monofunctional compound, from the viewpoint that the surface state of the polarizer to be formed is more excellent, it is preferable that the number of atoms NA of the smectic liquid crystal compound and the number of atoms NB of the monofunctional compound satisfy Expression (2).

$$0.40 \leq NB/NA \leq 0.55 \quad (2)$$

Further, in a case where the composition contains two or more kinds of smectic liquid crystal compounds and/or two or more kinds of monofunctional compounds, at least one smectic liquid crystal compound and at least one monofunctional compound may satisfy Expression (1) or Expression (2).

Hereinafter, each component contained in the composition for forming a polarizer will be described.

[Smectic Liquid Crystal Compound]

The smectic liquid crystal compound contained in the composition is not particularly limited as long as the smectic liquid crystal compound is a polymerizable liquid crystal compound that has two or more rings selected from the group consisting of an aromatic ring and an alicyclic ring and two polymerizable groups, exhibits a liquid crystal state of a smectic phase, and has a relationship of satisfying Expression (1) together with the monofunctional compound.

Examples of the smectic phase exhibited by the smectic liquid crystal compound include a smectic A phase and a smectic C phase. The smectic liquid crystal compound may exhibit a higher-order smectic phase. Examples of the higher-order smectic phase here include a smectic B phase, a smectic E phase, a smectic F phase, a smectic G phase, a smectic H phase, a smectic I phase, a smectic J phase, a smectic K phase, and a smectic L phase.

Further, the smectic liquid crystal compound may exhibit a nematic phase in addition to the smectic phase.

The smectic liquid crystal compound contains two polymerizable groups. The two polymerizable groups of the smectic liquid crystal compound may be the same as or different from each other.

Further, the smectic liquid crystal compound may contain three or more polymerizable groups.

The polymerizable group contained in the smectic liquid crystal compound is not particularly limited, but a polymerizable group that is radically polymerizable (radically polymerizable group) or a polymerizable group that is cationically polymerizable (cationically polymerizable group) is preferable.

As the radically polymerizable group, a known radically polymerizable group can be used, and an acryloyloxy group or a methacryloyloxy group is preferable. It is known that the acryloyloxy group tends to have a high polymerization rate, and the acryloyloxy group is preferable from the viewpoint of improving productivity, but the methacryloyloxy group can also be used as the polymerizable group.

As the cationically polymerizable group, a known cationically polymerizable group can be used, and examples thereof include an alicyclic ether group, a cyclic acetal group, a cyclic lactone group, a cyclic thioether group, a spiroorthoester group, and a vinyloxy group. Among these, an alicyclic ether group or a vinyloxy group is preferable, and an epoxy group, an oxetanyl group, or a vinyloxy group is more preferable.

Preferred examples of the polymerizable group include polymerizable groups represented by Formulae (P-1) to (P-30).

(P-1)

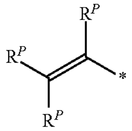

(P-2)

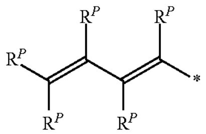

(P-3)

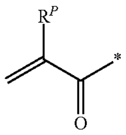

(P-4)

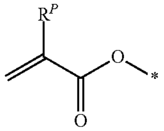

-continued (P-5)

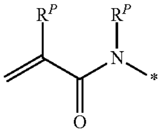

(P-6)

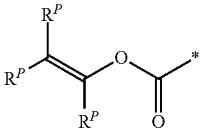

(P-7)

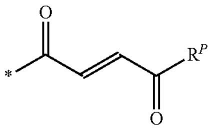

(P-8)

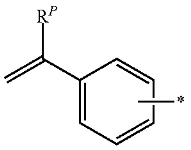

(P-9)

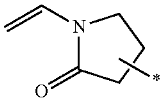

(P-10)

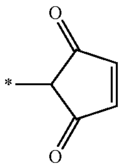

(P-11)

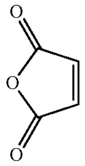

(P-12)

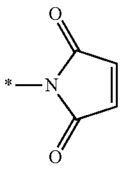

(P-13)

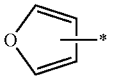

(P-14)

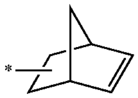

(P-15)

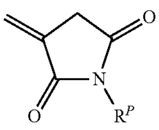

-continued (P-16)

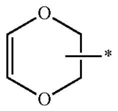

(P-17)

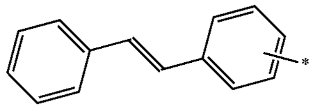

(P-18)

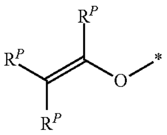

(P-19)

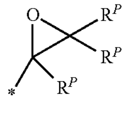

(P-20)

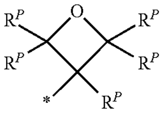

(P-21)

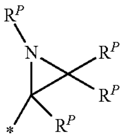

(P-22)

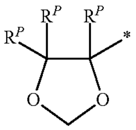

(P-23)

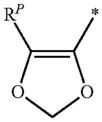

(P-24)

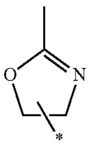

(P-25)

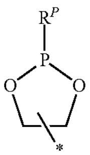

(P-26)

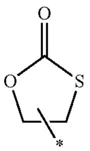

-continued (P-27)

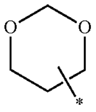

(P-28)

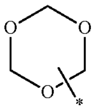

(P-29)

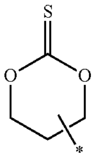

(P-30)

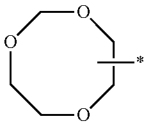

In Formulae (P-1) to (P-30), $R^P$ represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphate group ($—OPO(OH)_2$), or a sulfate group ($—OSO_3H$). A plurality of $R^P$'s may be the same as or different from each other.

Among these, a vinyl group represented by Formula (P-1), a butadiene group represented by Formula (P-2), a (meth)acrylic group represented by Formula (P-4), a (meth) acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9), a maleic anhydride represented by Formula (P-11), or a maleimide group represented by Formula (P-12) is preferable as the radically polymerizable group. Further, a vinyl ether group represented by Formula (P-18), an epoxy group represented by Formula (P-19), or an oxetanyl group represented by Formula (P-20) is preferable, and a (meth)acrylic group represented by Formula (P-4) or a (meth)acrylamide group represented by Formula (P-5) is more preferable as the cationically polymerizable group.

The smectic liquid crystal compound has two or more rings selected from the group consisting of an aromatic ring and an alicyclic ring. The aromatic ring and the alicyclic ring may be monocyclic rings or fused rings in which two or more rings are fused.

Further, in the present specification, a fused ring in which two or more rings are fused is regarded as one ring in the case of counting the number of rings in a compound.

Examples of the aromatic ring include an aromatic hydrocarbon ring having 6 to 20 carbon atoms and an aromatic heterocyclic ring having 3 to 20 carbon atoms.

Examples of the aromatic hydrocarbon ring having 6 to 20 carbon atoms include a phenylene group, a naphthylene group, a fluorene-diyl group, an anthracene-diyl group, and a tetracene-diyl group.

Examples of the atoms other than the carbon atoms constituting the aromatic heterocyclic ring include a nitrogen atom, a sulfur atom, and an oxygen atom. In a case where the aromatic heterocyclic ring has a plurality of atoms other than the carbon atoms, the plurality of atoms may be the same as or different from each other. Examples of the aromatic heterocyclic ring having 3 to 20 carbon atoms include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

From the viewpoints of the variety of designs of the mesogen skeleton and the availability of the raw materials, a phenylene group or a naphthylene group is preferable as the aromatic ring.

Examples of the alicyclic ring include a heterocyclic ring formed by substituting one or more of $—CH_2—$ constituting an aliphatic hydrocarbon ring having 5 to 20 carbon atoms and an aliphatic hydrocarbon ring having 5 to 20 carbon atoms with —O—, $—Si(CH_3)_2—$, —N(Z)— (Z represents hydrogen, an alkyl group having 1 to 4 carbon atoms, a cycloalkyl group, an aryl group, a cyano group, or a halogen atom), —C(O)—, —S—, —C(S)—, —S(O)—, $—SO_2—$, and a group obtained by combining two or more of these groups.

The aliphatic hydrocarbon ring may be saturated or unsaturated, but a saturated aliphatic hydrocarbon ring is preferable. As the alicyclic hydrocarbon group, for example, the description in paragraph [0078] of JP2012-21068A can be referred to, and the content thereof is incorporated in the specification of the present application.

As the alicyclic ring, a cycloalkane ring having 5 to 20 carbon atoms is preferable, a cyclohexane ring, a cycloheptane ring, a cyclooctane ring, a cyclododecane ring, or a cyclodocosane ring is more preferable, and a cyclohexane ring is still more preferable.

The aromatic ring or the alicyclic ring may have a substituent. Examples of the substituent include a halogen atom, a linear, branched, or cyclic alkyl group having 1 to 20 carbon atoms, a halogenated alkyl group having 1 to 20 carbon atoms, a cycloalkyl group having 3 to 20 carbon atoms, an alkoxy group having 1 to 20 carbon atoms, an alkenyl group having 2 to 20 carbon atoms, an alkynyl group having 2 to 20 carbon atoms, an aryl group having 6 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphate group ($—OPO(OH)_2$), a sulfate group ($—OSO_3H$), and known other substituents.

Further, as the substituent, the description in paragraph [0023] of JP-A-2007-234651 can be referred to, and the description thereof is incorporated in the present specification.

The smectic liquid crystal compound may have any aromatic ring selected from the group consisting of groups represented by Formulae (II-1) to (II-7).

(II-1)

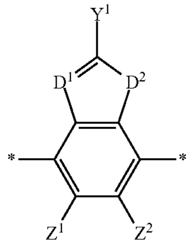

(II-2)

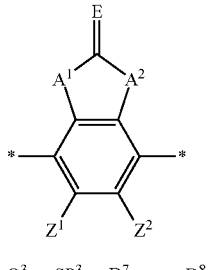

(II-3)

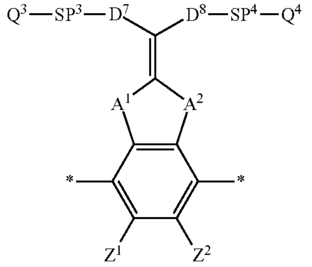

-continued (II-4)

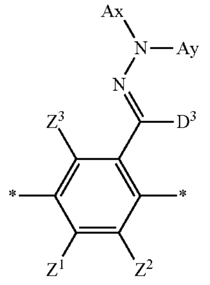

(II-5)

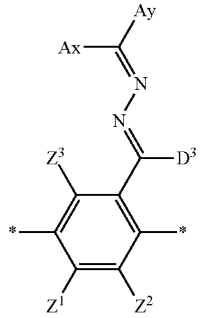

(II-6)

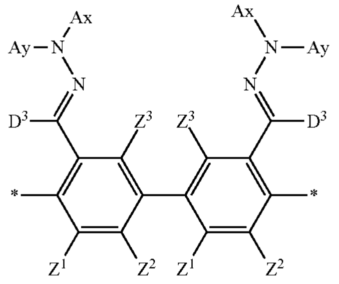

(II-7)

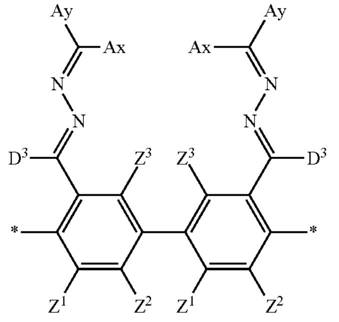

In Formulae (II-1) to (II-7), * represents a bonding position, that is, a bonding position with respect to a portion other than the aromatic ring contained in the smectic liquid crystal compound.

In Formula (II-1), $D^1$ represents N or CH, $D^2$ represents —S—, —O—, or —N(R")—, R" represents a hydrogen atom or an alkyl group having 1 to 6 carbon atoms, $Y^1$ representing an aromatic hydrocarbon group having 3 to 12 carbon atoms which may have a substituent, an aromatic heterocyclic group having 3 to 20 carbon atoms which may have a substituent, or an alicyclic hydrocarbon group having 5 to 20 carbon atoms which may have a substituent, and one or more of —$CH_2$— constituting the alicyclic hydrocarbon group may be substituted with —O—, —S—, or —NH—.

Examples of the alkyl group having 1 to 6 carbon atoms as R" include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms as $Y^1$ include an aryl group such as a phenyl group, a 2,6-diethylphenyl group, or a naphthyl group.

Examples of the aromatic heterocyclic group having 3 to 12 carbon atoms as Y' include a heteroaryl group such as a thienyl group, a thiazolyl group, a furyl group, and a pyridyl group.

Examples of the alicyclic hydrocarbon group having 5 to 20 carbon atoms as $Y^1$ include a cyclohexylene group, a cyclopentylene group, a norbornylene group, and an adamantylene group.

In a case where Y' represents an aromatic hydrocarbon group having 6 to 12 carbon atoms, the aromatic hydrocarbon group may be monocyclic or polycyclic. In a case where $Y^1$ represents an aromatic heterocyclic group having 3 to 12 carbon atoms, the aromatic heterocyclic group may be monocyclic or polycyclic. In a case where Y' represents an alicyclic hydrocarbon group f having 5 to 20 carbon atoms, the alicyclic hydrocarbon group may be monocyclic or polycyclic.

Further, examples of the substituent that $Y^1$ may have include an alkyl group, an alkoxy group, and a halogen atom.

As the alkyl group, a linear, branched, or cyclic alkyl group having 1 to 18 carbon atoms is preferable, an alkyl group having 1 to 8 carbon atoms (such as a methyl group, an ethyl group, a propyl group, an isopropyl group, an n-butyl group, an isobutyl group, a sec-butyl group, a t-butyl group, or a cyclohexyl group) is more preferable, an alkyl group having 1 to 4 carbon atoms is still more preferable, and a methyl group or an ethyl group is particularly preferable.

As the alkoxy group, an alkoxy group having 1 to 18 carbon atoms is preferable, an alkoxy group having 1 to 8 carbon atoms (such as a methoxy group, an ethoxy group, an n-butoxy group, or a methoxyethoxy group) is more preferable, an alkoxy group having 1 to 4 carbon atoms is still more preferable, and a methoxy group or an ethoxy group is particularly preferable.

Examples of the halogen atom include a fluorine atom, a chlorine atom, a bromine atom, and an iodine atom. Among these, a fluorine atom or a chlorine atom is preferable.

In Formulae (II-1) to (II-7), Z', $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atoms, a cyano group, a nitro group, —$OR^{12}$, —$NR^{12}R^{13}$ or —$SR^{12}$, —$COOR^{12}$, or —$COR^{12}$, $R^{12}$ and $R'^{3}$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and a methyl group, an ethyl group, or a tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, or an ethylcyclohexyl group, a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, or cyclodecadiene, and a polycyclic saturated hydrocarbon group such as a bicyclo[2.2.1]heptyl group, a bicyclo[2.2.2]octyl group, a tricyclo[$5.2.1.0^{2,6}$]decyl group, a tricyclo[$3.3.1.1^{3,7}$]decyl group, a tetracyclo[$6.2.1.1^{3,6}.0^{2,7}$]dodecyl group, or an adamantyl group.

As the monovalent aromatic hydrocarbon group having 6 to 20 carbon atoms, an aryl group having 6 to 12 carbon atoms is preferable, a phenyl group, a 2,6-diethylphenyl group, a naphthyl group, or a biphenyl group is more preferable, and a phenyl group is still more preferable.

Examples of the monovalent aromatic heterocyclic group having 6 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom. Among these, a fluorine atom, a chlorine atom, or a bromine atom is preferable.

Examples of the alkyl group having 1 to 6 carbon atoms as $R^{12}$ or $R^{13}$ include a methyl group, an ethyl group, a propyl group, an isopropyl group, an n-butyl group, an isobutyl group, a sec-butyl group, a tert-butyl group, an n-pentyl group, and an n-hexyl group.

Further, $Z^1$ and $Z^2$ may be bonded to each other to form an aromatic ring as described above, and examples of the structure in a case where $Z^1$ and $Z^2$ in Formula (II-1) are bonded to each other to form an aromatic ring include a group represented by Formula (II-1a). In Formula (II-1a), * represents a bonding position, and $Q^1$, $Q^2$, and $Y^1$ each have the same definition as described in the section of Formula (II-1).

(II-1a)

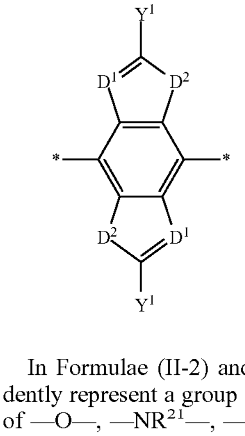

In Formulae (II-2) and (II-3), $A^1$ and $A^2$ each independently represent a group selected from the group consisting of —O—, —$NR^{21}$—, —S—, and —CO—, and $R^{21}$ represents a hydrogen atom or a substituent.

Examples of the substituent as $R^{21}$ are the same as the substituents that $Y^1$ in Formula (II-1) may have. Further, as the substituent represented by $R^{21}$, the description in paragraphs [0035] to [0045] of JP2008-107767A can be referred to, and the content thereof is incorporated in the present specification.

In Formula (I1-2), E represents a non-metal atom of Groups 14 to 16 to which a hydrogen atom or a substituent may be bonded.

Further, examples of the non-metal atom of Groups 14 to 16 represented by E include an oxygen atom, a sulfur atom, a nitrogen atom having a substituent, and a carbon atom having a substituent. Examples of the substituent include an alkyl group, an alkoxy group, an alkyl substituted alkoxy group, a cyclic alkyl group, an aryl group (such as a phenyl group or a naphthyl group), a cyano group, an amino group, a nitro group, an alkylcarbonyl group, a sulfo group, and a hydroxy group. Further, as the substituent, the description in paragraphs [0035] to [0045] of JP2008-107767A can be referred to, and the content thereof is incorporated in the present specification.

Further, in Formula (II-3), $D^7$ and $D^8$ each independently represent a single bond, —CO—, —O—, —S—, —C(=S)—, —$CR^1R^2$—, —$CR^3$=$CR^4$—, —$NR^5$—, or a divalent linking group consisting of two or more of these, and $R^1$ to $R^5$ each independently represent a hydrogen atom, a fluorine atom, or an alkyl group having 1 to 12 carbon atoms.

Here, examples of the divalent linking group as $D^7$ and $D^1$ include —CO—, —O—, —CO—O—, —C(=S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among these, any of —CO—, —O—, or —CO—O— is preferable.

Further, in Formula (I1-3), $SP^3$ and $SP^4$ each independently represent a single bond, a linear or branched alkylene group having 1 to 12 carbon atoms, or a divalent linking group in which one or more of —$CH_2$— constituting a linear or branched alkylene group having 1 to 12 carbon atoms have been substituted with —O—, —S—, —NH—, —N(Q)-, or —CO—, and Q represents a substituent. Examples of the substituent are the same as the substituents that $Y^1$ in Formula (II-1) may have.

Examples of the linear or branched alkylene group having 1 to 12 carbon atoms as $SP^3$ and $SP^4$ include a methylene group, an ethylene group, a propylene group, a butylene group, a pentylene group, a hexylene group, a methylhexylene group, and a heptylene group.

Further, in Formula (II-3), $Q^3$ and $Q^4$ each independently represent a monovalent organic group, and at least one of $Q^3$ or $Q^4$ represents a polymerizable group.

Examples of the monovalent organic group as $Q^3$ and $Q^4$ include an alkyl group, an aryl group, and a heteroaryl group. The alkyl group may be linear, branched, or cyclic, and it is preferable that the alkyl group is linear. The number of carbon atoms of the alkyl group is preferably in a range of 1 to 30, more preferably in a range of 1 to 20, and still more preferably in a range of 1 to 10. Further, the aryl group may be monocyclic or polycyclic, and it is preferable that the aryl group is monocyclic. The number of carbon atoms of the aryl group is preferably in a range of 6 to 25 and more preferably in a range of 6 to 10. Further, the heteroaryl group may be monocyclic or polycyclic. The number of heteroatoms constituting the heteroaryl group is preferably in a range of 1 to 3. It is preferable that the heteroatom constituting the heteroaryl group is a nitrogen atom, a sulfur atom, or an oxygen atom. The number of carbon atoms of the heteroaryl group is preferably in a range of 6 to 18 and more preferably in a range of 6 to 12. Further, the alkyl group, the aryl group, and the heteroaryl group may be unsubstituted or may have a substituent. Examples of the substituent are the same as the substituents that $Y^1$ in Formula (II-1) may have.

Examples of the polymerizable group represented by at least one of $Q^3$ or $Q^4$ are the same as those exemplified as the radically polymerizable group or the cationically polymerizable group described above. Among these, a polymerizable group represented by any of Formulae (P-1) to (P-30) is preferable.

In Formulae (II-4) to (II-7), Ax represents an organic group having 2 to 30 carbon atoms which has at least one aromatic ring selected from the group consisting of an aromatic hydrocarbon ring and an aromatic heterocyclic ring, and Ay represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring.

The aromatic ring of Ax and Ay may have a substituent. Further, Ax and Ay may be bonded to each other to form a ring.

Examples of Ax and Ay include those described in paragraphs [0039] to [0095] of WO2014/010325A, and the description thereof is incorporated in the present specification.

In Formulae (II-4) to (II-7), $D^3$ represents a hydrogen atom or an alkyl group having 1 to 6 carbon atoms which may have a substituent.

Examples of the alkyl group having 1 to 6 carbon atoms as $D^3$ include a methyl group, an ethyl group, a propyl group, an isopropyl group, an n-butyl group, an isobutyl group, a sec-butyl group, a tert-butyl group, an n-pentyl group, and an n-hexyl group. Examples of the substituent that the alkyl group having 1 to 6 carbon atoms as $D^3$ may have are the same as the substituents that $Y^1$ in Formula (Ar-1) may have.

The smectic liquid crystal compound may have any of forward wavelength dispersibility or reverse wavelength dispersibility, but it is preferable that the smectic liquid crystal compound has forward wavelength dispersibility.

In the present specification, the "polymerizable liquid crystal compound having forward wavelength dispersibility" indicates that in a case where the in-plane retardation (Re) value of a phase difference film prepared using this polymerizable liquid crystal compound at a specific wavelength (visible light range), the Re value decreases as the measurement wavelength increases.

<Smectic Liquid Crystal Compound Represented by Formula (A-1)>

From the viewpoints of availability of raw materials, synthetic suitability, and/or handleability, a compound represented by Formula (A-1) is preferable as the smectic liquid crystal compound.

$$Q^1\text{-}V^1\text{—}SP^1\text{—}X^1\text{-}(Ma\text{-}La)_{na}\text{—}X^2\text{—}SP^2\text{—}V^2\text{-}Q^2 \qquad \text{(A-1)}$$

In Formula (A-1), $Q^1$ and $Q^2$ each independently represent a polymerizable group.

Further, $V^1$, $V^2$, $X^1$, and $X^2$ each independently represent a single bond or a divalent linking group.

Further, $SP^1$ and $SP^2$ each independently represent a divalent spacer group.

Further, Ma represents an aromatic ring or an alicyclic ring which may have a substituent. Here, a plurality of Ma's may be the same as or different from each other.

Further, La represents a single bond or a divalent linking group. Here, a plurality of La's may be the same as or different from each other.

Further, na represents an integer of 2 to 10.

$Q^1$ and $Q^2$ represent preferably a radically polymerizable group or a cationically polymerizable group, more preferably a polymerizable group represented by any of Formulae (P-1) to (P-30), and still more preferably a polymerizable group represented by any of Formulae (P-1), (P-2), (P-4) to (P-9), (P-11), (P-12), and (P-18) to (P-20).

Examples of the divalent linking group represented by $V^1$, $V^2$, $X^1$, $X^2$, and La include —O—, —$(CH_2)_g$—, —$(CF_2)_g$—, —$Si(CH_3)_2$—, —$(Si(CH_3)_2O)_g$—, —$(OSi(CH_3)_2)_g$— (g represents an integer of 1 to 10), —N(Z)—, —C(Z)=C(Z')—, —C(Z)=N—, —N=C(Z)—, —$C(Z)_2$—$C(Z')_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, —C(O)S—, and a group obtained by combining two or more of these groups.

It is preferable that $V^1$, $V^2$, $X^1$, $X^2$, and La represent a single bond, —O—, —$(CH_2)_g$—, —C(O)—, —OC(O)—, —C(O)O—, or a group obtained by combining two or more of these groups.

In Formula (A-1), examples of the spacer group represented by SP and $SP^2$ include a linear or branched alkylene group having 1 to 50 carbon atoms and a divalent linking group in which one or more of —$CH_2$— constituting the linear or branched alkylene group having 1 to 50 carbon atoms are substituted with a group selected from the group consisting of —O—, —$Si(CH_3)_2$—, —$(Si(CH_3)_2O)_g$—, —$(OSi(CH_3)_2)_g$— (g represents an integer of 1 to 10), —N(Z)—, —C(Z)=C(Z')—, —C(Z)=N—, —N=C(Z)—, —$C(Z)_2$—$C(Z')_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —$SO_2$—, —(O)S(O)O—, —O(O)S(O)O—, —SC(O)—, —C(O)S—, and a group obtained by combining two or more of these groups.

It is preferable that $SP^1$ and $SP^2$ represent a single bond, a linear or branched alkylene group having 1 to 12 carbon atoms, or a divalent linking group in which one or more of —$CH_2$-constituting a linear or branched alkylene group having 1 to 12 carbon atoms are substituted with —O—, —S—, —NH—, or —CO—.

In Formula (A-1), examples of the aromatic ring and the alicyclic ring represented by Ma are the same as those described for the aromatic ring and the alicyclic ring contained in the smectic liquid crystal compound described above, including the preferred embodiments thereof.

Further, examples of the substituents that the aromatic ring and the alicyclic ring represented by Ma may have are also the same as those described for the substituents that the aromatic ring and the alicyclic ring contained in the smectic liquid crystal compound may have, including the preferred embodiments thereof.

In Formula (A-1), na represents an integer of 2 to 10, preferably an integer of 2 to 8, and more preferably an integer of 2 to 6.

As the smectic liquid crystal compound, compounds exhibiting a liquid crystal state of a smectic phase, among the compounds described in paragraphs [0033] to [0039] of JP2008-19240A, paragraphs [0037] to [0041] of JP2008-214269A, and paragraphs [0033] to [0040] of JP2006-215437A, may be used.

Examples of the smectic liquid crystal compound represented by Formula (A-1) include compounds represented by the following structural formulae. Further, the smectic liquid crystal compound contained in the composition is not limited to such compounds.

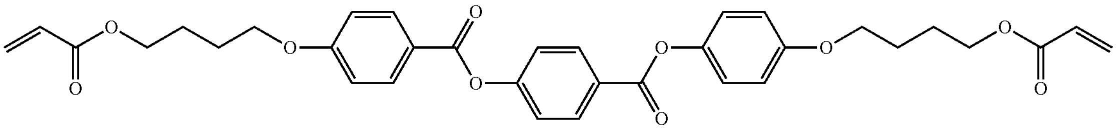

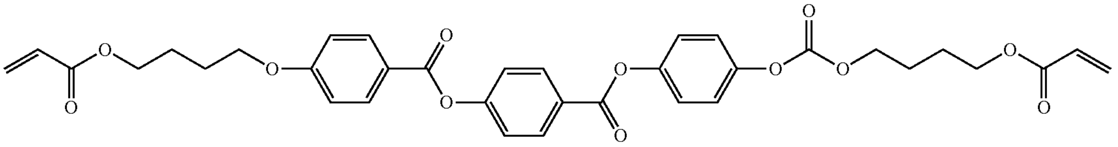

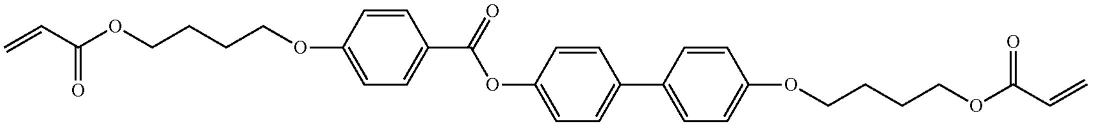

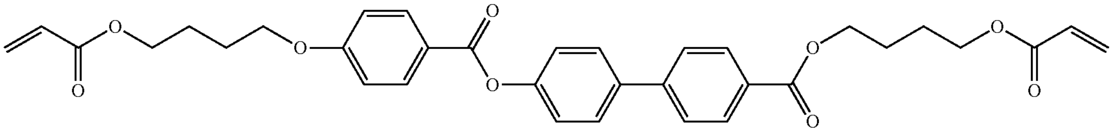

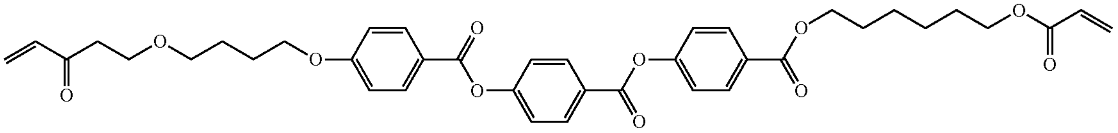

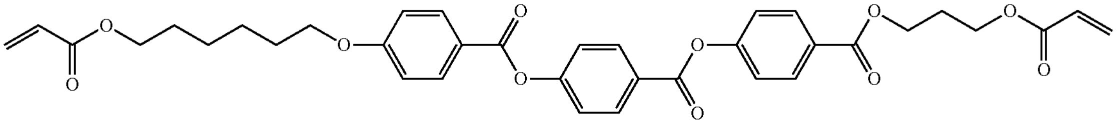

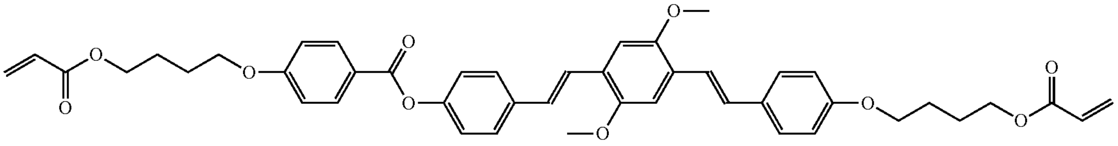

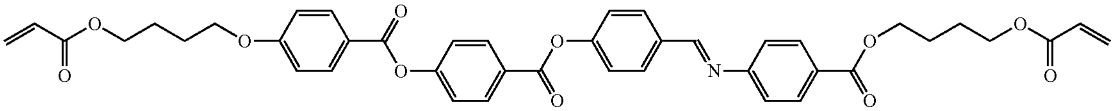

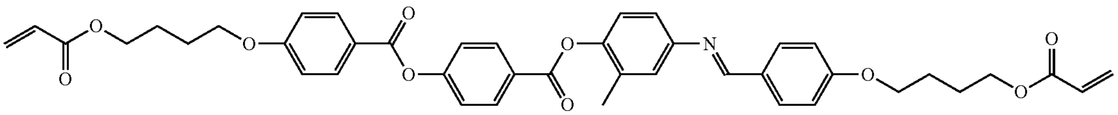

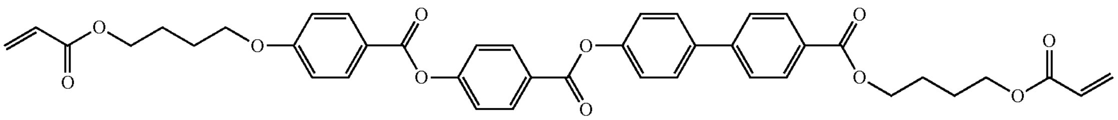

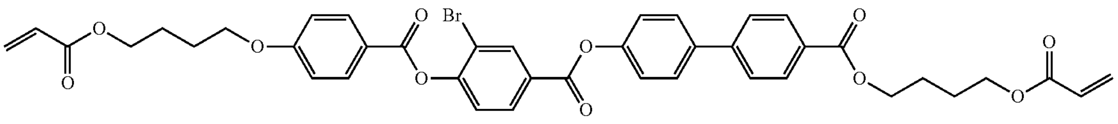

-continued
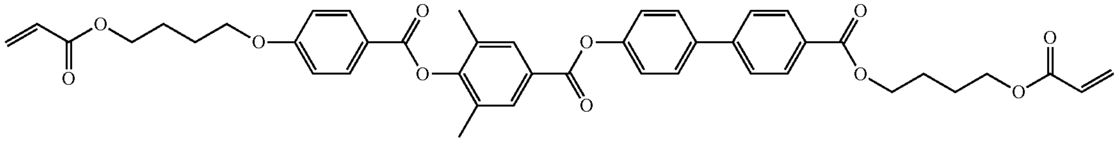
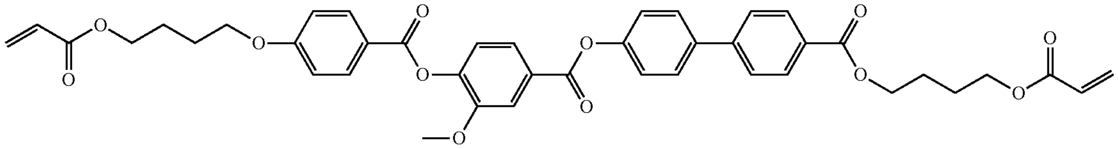
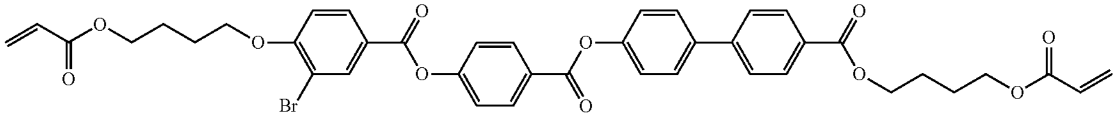
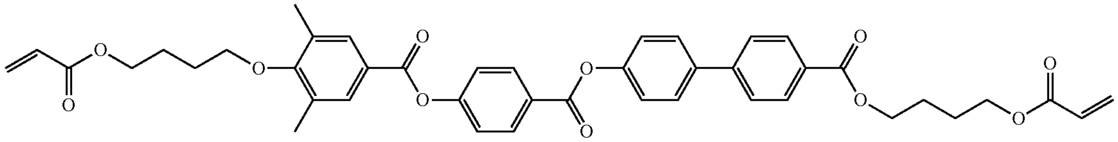
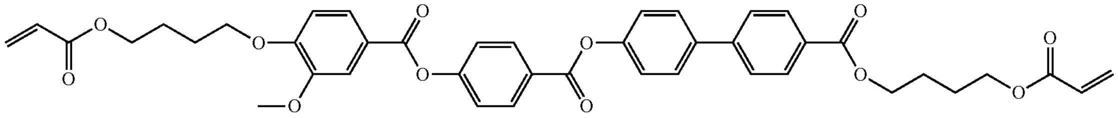
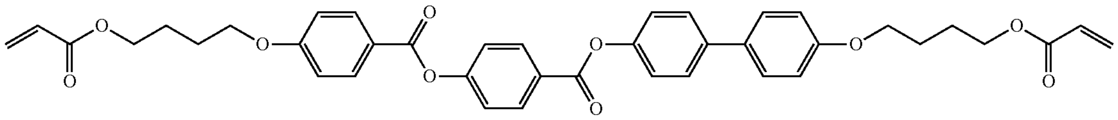
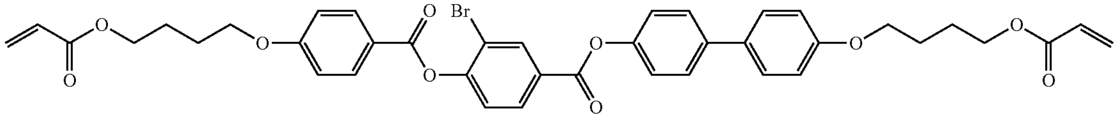
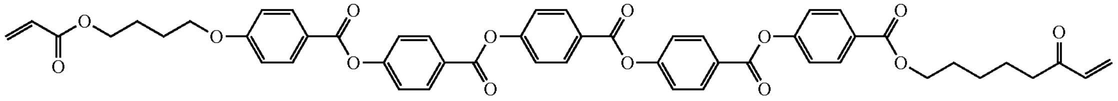
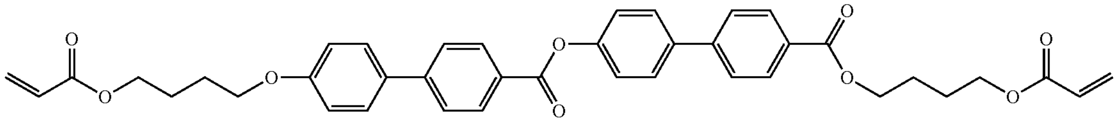
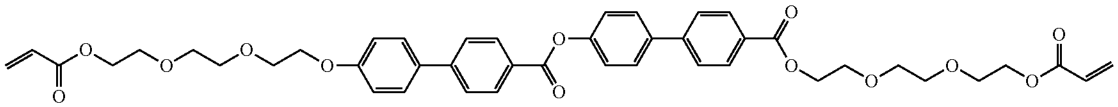
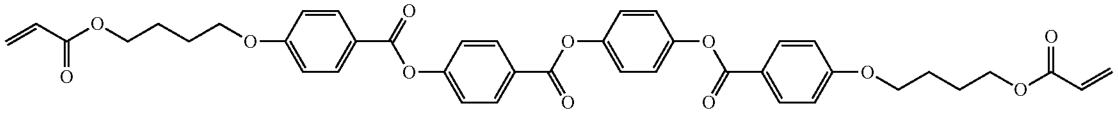
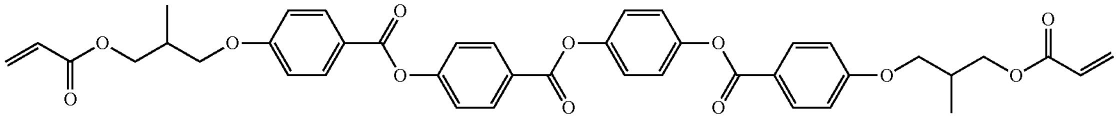
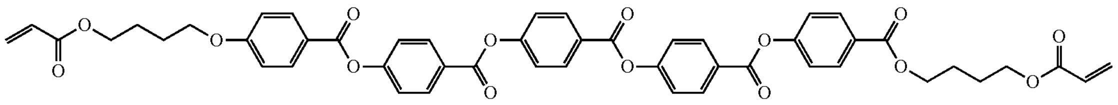
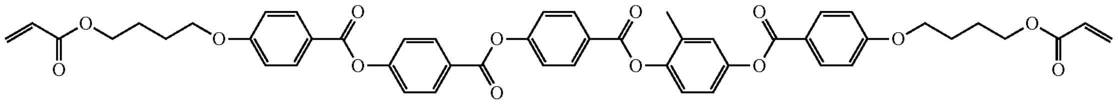

-continued
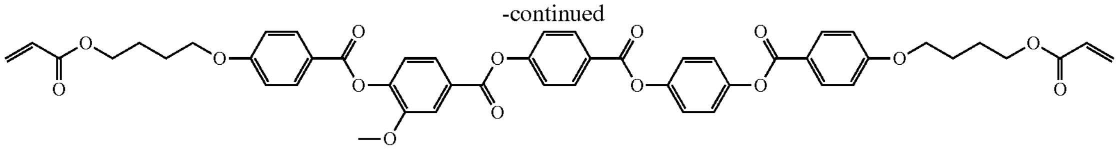
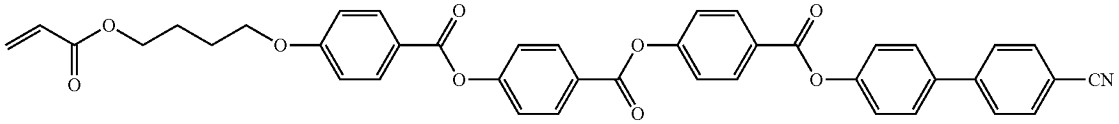
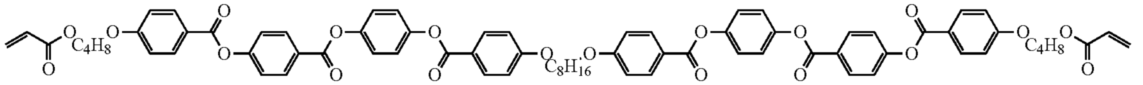
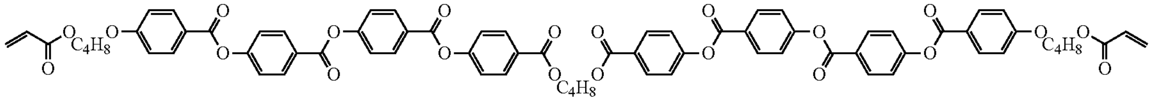
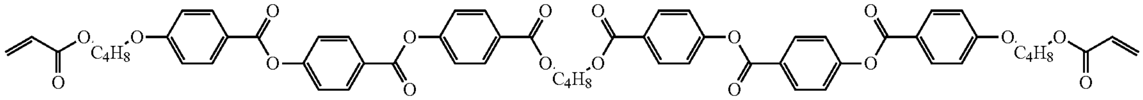
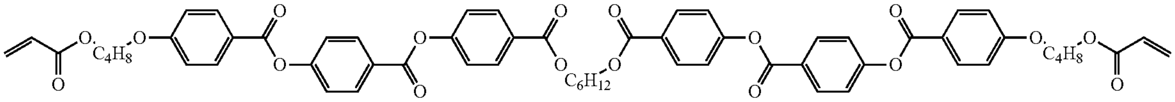
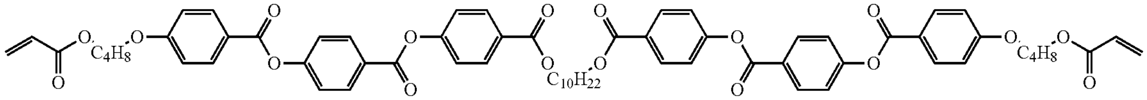
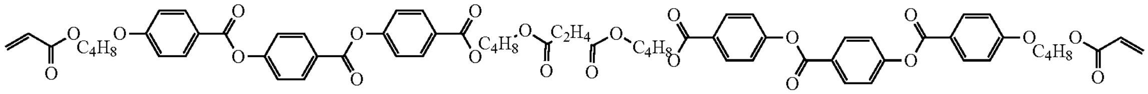
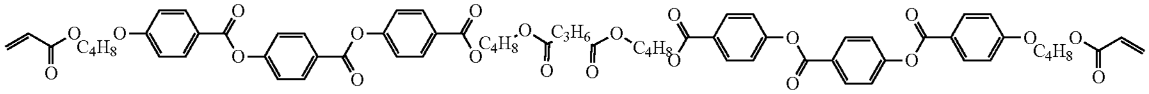
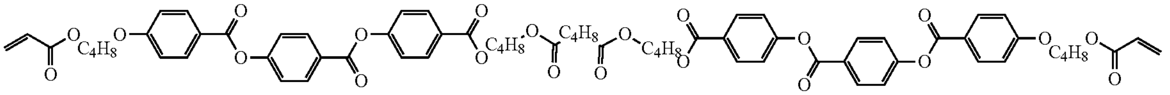
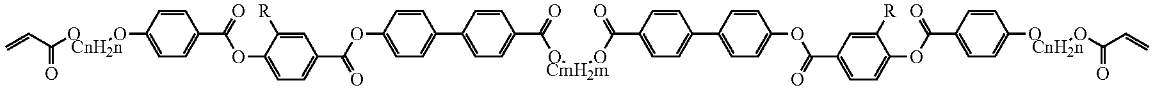
The combinations of n, m, and R in the structural formulae shown above are listed in the table below.
TABLE 1
| n | m | R |
|---|---|---|
| 4 | 4 | H |
| 4 | 6 | H |
| 4 | 10 | H |
| 6 | 10 | H |
TABLE 1-continued
| n | m | R |
|---|---|---|
| 6 | 12 | H |
| 4 | 8 | OCH3 |
| 4 | 12 | OCH3 |
| 6 | 10 | Br |
| 6 | 12 | Br |
| 8 | 12 | OCH3 |
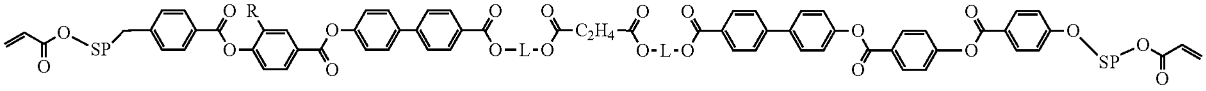

The combinations of SP, L, and R in the structural formulae shown above are listed in the table below.
TABLE 2
| SP | L | R |
|---|---|---|
| —(CH2)4— | —(CH2)3— | H |
| —(CH2)4— | —(CH2)3— | Br |
TABLE 2-continued
| SP | L | R |
|---|---|---|
| —(CH2)4— | —(CH2)3— | OCH3 |
| —CH2CH(CH3)CH2— | —(CH2)3— | H |
| —(CH2CH2O)2CH2CH3— | —(CH2)3— | H |
| —(CH2CH2O)2CH2CH3— | —(CH2CH20)2CH2CH3— | H |
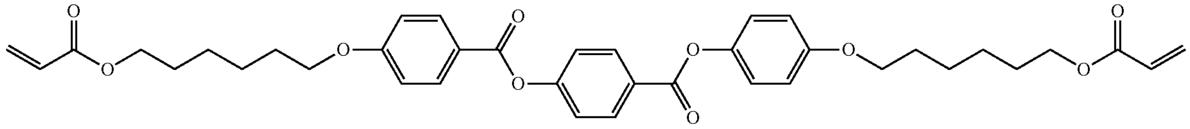
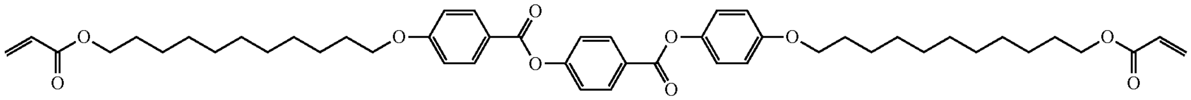
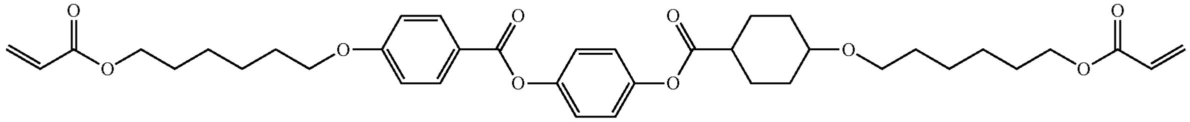
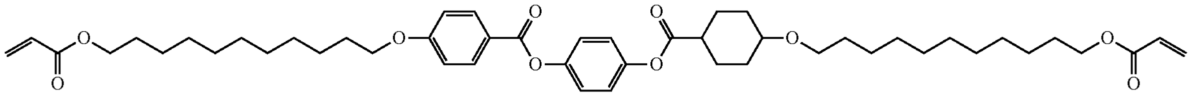
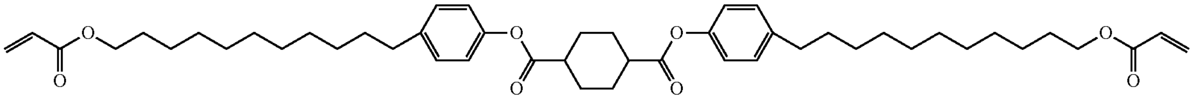
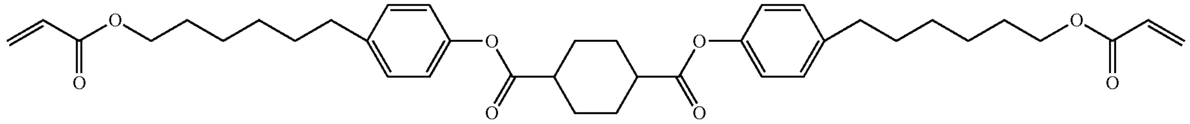
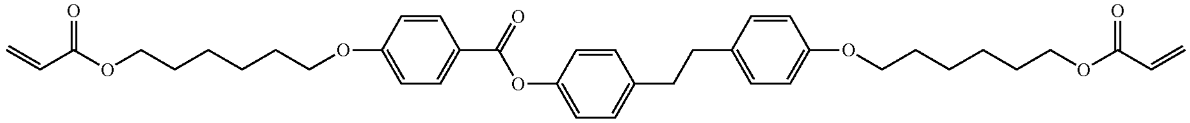
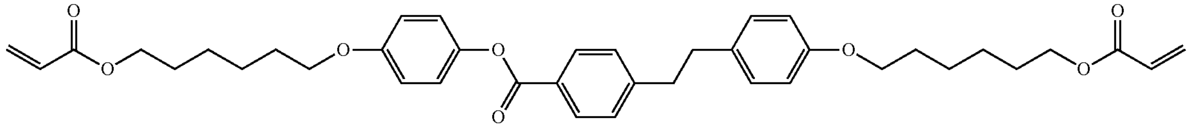
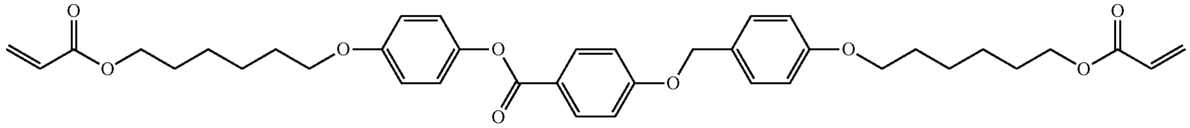
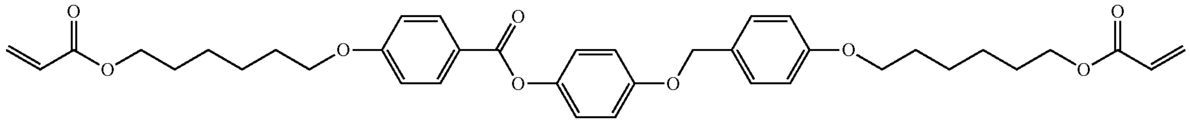
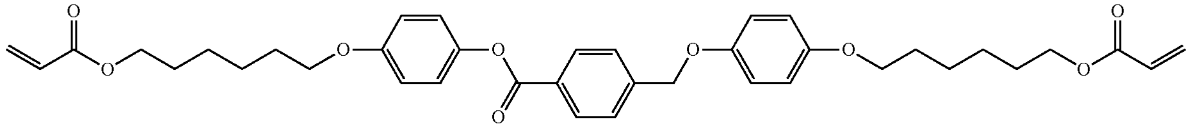
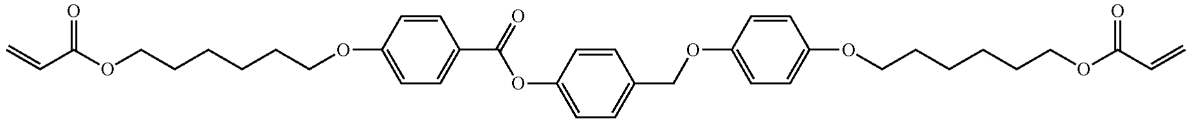

In a case where the smectic liquid crystal compound is a compound represented by Formula (A-1), it is preferable that atoms which are the starting point and the ending point during counting the number of atoms in a case where the numerical value obtained by counting the number of atoms on a bond connecting two atoms contained in the smectic liquid crystal compound at the shortest distance is maximized are respectively contained in one and the other of $Q^1$ and $Q^2$. In other words, it is preferable that the number of atoms NA of the smectic liquid crystal compound is the numerical value obtained by counting the number of atoms on a bond connecting an atom constituting $Q^1$ that is present on one terminal of Formula (A-1) representing the smectic liquid crystal compound and an atom constituting $Q^2$ that is present on the other terminal thereof at the shortest distance.

The content of the smectic liquid crystal compound is preferably in a range of 50 to 99 parts by mass and more preferably in a range of 60 to 95 parts by mass in a case where the total mass of the solid content of the composition is set to 100 parts by mass. Further, the solid content of the composition indicates all components of the composition excluding solvents.

[Monofunctional Compound]

The monofunctional polymerizable compound (monofunctional compound) contained in the composition is not particularly limited as long as the monofunctional polymerizable compound has two or more rings selected from the group consisting of an aromatic ring and an alicyclic ring and one polymerizable group and has a relationship of satisfying Expression (1) together with the smectic liquid crystal compound.

The polymerizable group of the monofunctional compound is not particularly limited, and examples thereof are the same as the polymerizable groups contained in the smectic liquid crystal compound.

Among these, a polymerizable group represented by any of Formulae (P-1) to (P-30) is preferable, a polymerizable group represented by any of Formulae (P-1), (P-2), (P-4) to (P-9), (P-11), (P-12), and (P-18) to (P-20) is more preferable, and a polymerizable group represented by Formula (P-4) or (P-5) is still more preferable.

The monofunctional compound has two or more rings selected from the group consisting of an aromatic ring and an alicyclic ring.

The ring selected from the group consisting of an aromatic ring and an alicyclic ring of the monofunctional compound is the same as the ring selected from the group consisting of an aromatic ring and an alicyclic of the smectic liquid crystal compound described above, including suitable embodiments thereof.

<Monofunctional Compound Represented by Formula (B-1)>

From the viewpoints of availability of raw materials, synthetic suitability, and/or handleability, a compound represented by Formula (B-1) is preferable as the monofunctional compound.

$$Q^3\text{-}V^3\text{—}SP^3\text{—}X^3\text{-}(Mb\text{-}Lb)_{nb}\text{-}Tb \qquad (B\text{-}1)$$

In Formula (B-1), $Q^3$ represents a polymerizable group.

Further, $V^3$ and $X^3$ each independently represent a single bond or a divalent linking group.

Further, $SP^3$ represents a divalent spacer group.

Further, Mb represents an aromatic ring or an alicyclic ring which may have a substituent. Here, a plurality of Mb's may be the same as or different from each other.

Further, Lb represents a single bond or a divalent linking group. Here, a plurality of Lb's may be the same as or different from each other.

Further, nb represents an integer of 2 to 5.

Further, Tb represents a hydrogen atom or a monovalent substituent.

In Formula (B-1), $Q^3$, $V^3$, $SP^3$, $X^3$, Mb, and Lb each have the same definition as that for $Q^1$ ($Q^2$), $V^1$ ($V^2$), $SP^1$ ($SP^2$), $X^1$ ($X^2$), Ma, and La in Formula (A-1), including the preferred embodiments thereof.

In Formula (B-1), nb represents preferably an integer of 2 to 4 and more preferably 2 or 3.

In Formula (B-1), Tb represents a hydrogen atom or a monovalent substituent.

Examples of the monovalent substituent represented by Tb include a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphate group ($—OPO(OH)_2$), or a sulfate group ($—OSO_3H$), and other known substituents.

Further, as the monovalent substituent represented by Tb, the description in paragraph [0023] of JP2007-234651A can be referred to, and the description thereof is incorporated in the present specification.

Tb represents preferably a hydrogen atom, a halogen atom, or a linear or branched alkyl group having 1 to 10 carbon atoms and more preferably a hydrogen atom or a linear alkyl group having 1 to 6 carbon atoms.

Examples of the monofunctional compound represented by Formula (B-1) include compounds represented by Structural Formulae B1 to B13. Further, the monofunctional compound contained in the composition is not limited to the compounds represented by Structural Formulae B1 to B13.

B1
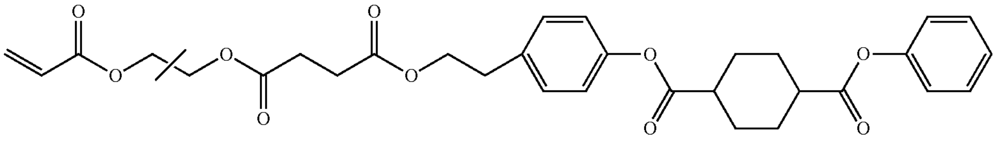
B2
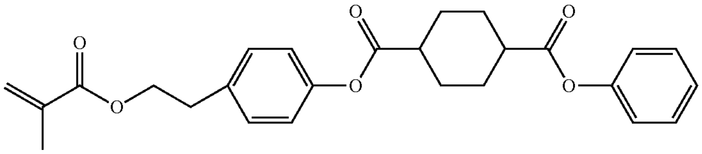
B3
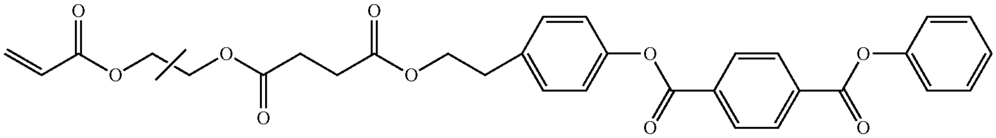
B4
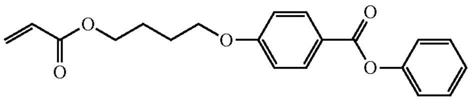
B5
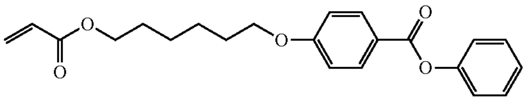
B6
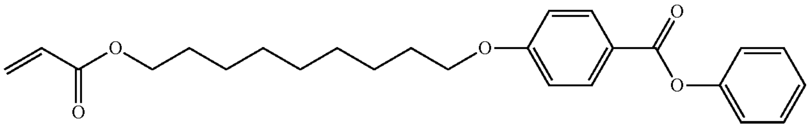
B7
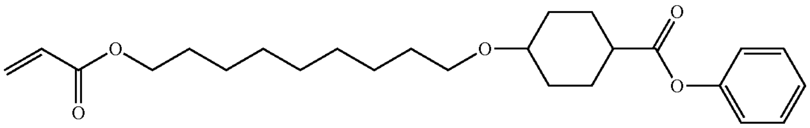
B8
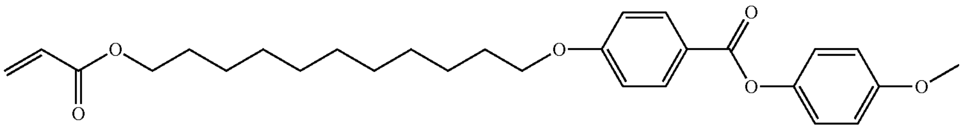
B9
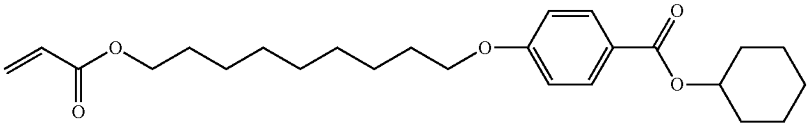
B10
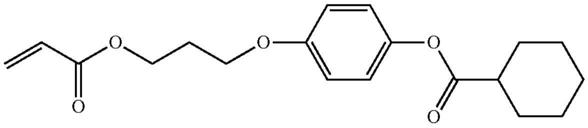
B11
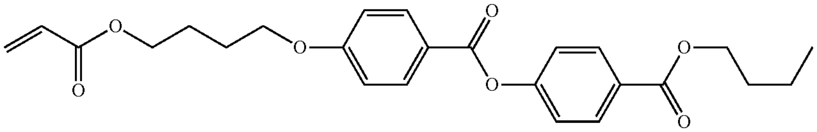
B12
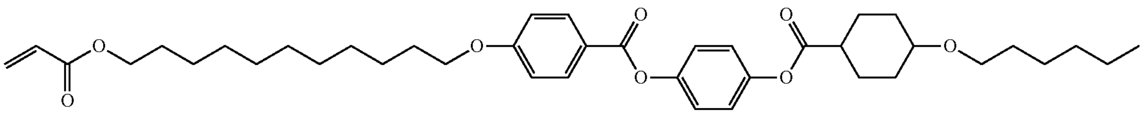

-continued

B13

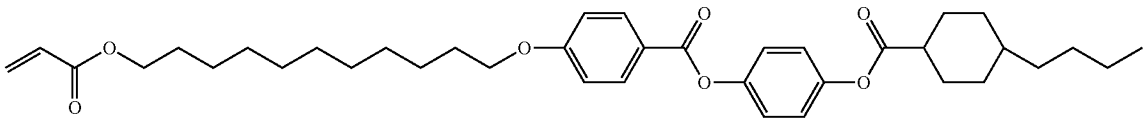

The content of the monofunctional compound is preferably in a range of 1 to 30 parts by mass and more preferably in a range of 3 to 25 parts by mass in a case where the total mass of the solid content of the composition is set to 100 parts by mass.

In a case where the monofunctional compound is a compound represented by Formula (B-1), it is preferable that atoms which are the starting point and the ending point during counting the number of atoms in a case where the numerical value obtained by counting the number of atoms on a bond connecting two atoms contained in the monofunctional compound at the shortest distance is maximized are respectively contained in one and the other of $Q^3$ and Tb. In other words, it is preferable that the number of atoms NB of the monofunctional compound is the numerical value obtained by counting the number of atoms on a bond connecting an atom constituting $Q^3$ that is present on one terminal of Formula (B-1) representing the monofunctional compound and an atom constituting Tb that is present on the other terminal thereof at the shortest distance.

rings are considered to be the same as each other in a case where both objects to be compared are alicyclic rings even with different ring structures or different substituents. Further, the arrangements of the rings do not include a structure of a linking portion between two rings. For example, the arrangements of the rings are considered to be the same as each other in a case where both rings to be compared are aromatic rings even in a case where the rings have skeletons different from each other, such as a phenylene group and a naphthylene group, and the arrangements of the rings are considered to be the same as each other in a case where both rings to be compared are alicyclic rings even in a case where the rings have skeletons different from each other, such as cyclohexylene and cyclopentalene.

More specifically, the arrangement of rings of the following compound B1 which is an example of the monofunctional compound is the same as the arrangement of rings of the following compound A1 which is an example of the smectic liquid crystal compound.

A1

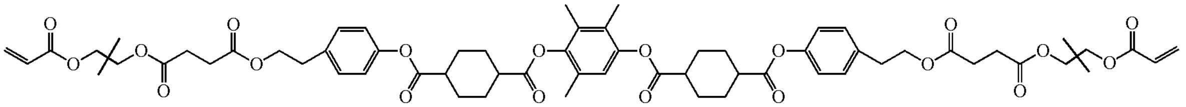

B1

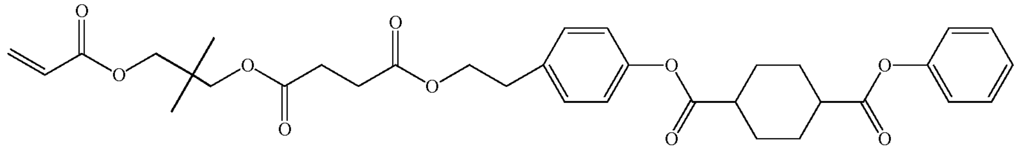

From the viewpoint that the surface state of the polarizer to be formed is more excellent, it is preferable that the arrangement (hereinafter, also simply referred to as "ring arrangement") of the rings selected from the group consisting of an aromatic ring and an alicyclic ring contained in the monofunctional compound is the same as the arrangement of the rings contained in the smectic liquid crystal compound.

For example, in a case where the smectic liquid crystal compound is a compound represented by Formula (A-1) and the monofunctional compound is a compound represented by Mb in Formula (B-1), it is preferable that the arrangement of rings represented by Formula (B-1) and arranged between $X^3$ and Tb is the same as the arrangement of rings represented by Ma in Formula (A-1) and arranged between $X^1$ and $X^2$.

Here, in regard to the arrangements of rings contained in the smectic liquid crystal compound and the monofunctional compound, the arrangements of the rings are considered to be the same as each other in a case where both objects to be compared are aromatic rings even with different ring structures or different substituents, and the arrangements of the

[Dichroic Material]

The dichroic material contained in the composition is not particularly limited, and examples thereof include a visible light absorbing material (dichroic dye), a light emitting material (such as a fluorescent material or a phosphorescent material), an ultraviolet absorbing material, an infrared absorbing material, a non-linear optical material, a carbon nanotube, and an inorganic material (for example, a quantum rod). Further, known dichroic materials (dichroic dyes) of the related art can be used.

Specific examples of the dichroic material include compounds described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] of JP2011-237513A, paragraphs [0005] to [0051] of JP2016-006502, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

Two or more kinds of dichroic materials may be used in combination. For example, from the viewpoint of making the color of the polarizer to be formed closer to black, it is preferable that at least one dichroic material having a maximal absorption wavelength in a wavelength range of 370 to 550 nm and at least one dichroic material having a maximal absorption wavelength in a wavelength range of 500 to 700 nm are used in combination.

From the viewpoint that the surface state of the polarizer to be formed is satisfactory and the degree of alignment is further increased, the content of the dichroic material is preferably in a range of 1% to 80% by mass, more preferably in a range of 2% to 70% by mass, and still more preferably in a range of 3% to 60% by mass with respect to the total mass of the solid content of the composition.

Further, from the viewpoint that the surface state of the polarizer to be formed is satisfactory and the degree of alignment is further increased, the content of the dichroic material is preferably in a range of 1 to 400 parts by mass, more preferably in a range of 2 to 100 parts by mass, and still more preferably in a range of 4 to 40 parts by mass with respect to 100 parts by mass of the smectic liquid crystal compound.

[Solvent]

From the viewpoint of workability, it is preferable that the composition contains a solvent.

Examples of the solvent include organic solvents such as ketone compounds (such as acetone, 2-butanone, methyl isobutyl ketone, cyclopentanone, and cyclohexanone), ether compounds (such as dioxane, tetrahydrofuran, tetrahydropyran, dioxolane, tetrahydrofurfuryl alcohol, and cyclopentyl methyl ether), aliphatic hydrocarbon compounds (such as hexane), alicyclic hydrocarbon compounds (such as cyclohexane), aromatic hydrocarbon compounds (such as benzene, toluene, xylene, and trimethylbenzene), halogenated carbon compounds (such as dichloromethane, trichloromethane (chloroform), dichloroethane, dichlorobenzene, and chlorotoluene), ester compounds (such as methyl acetate, ethyl acetate, butyl acetate, and diethyl carbonate), alcohol compounds (such as ethanol, isopropanol, butanol, and cyclohexanol), cellosolve compounds (such as methyl cellosolve, ethyl cellosolve, and 1,2-dimethoxyethane), cellosolve acetate compounds, sulfoxide compounds (such as dimethyl sulfoxide), amide compounds (such as dimethylformamide, dimethylacetamide, N-methylpyrrolidone, N-ethylpyrrolidone, and 1,3-dimethyl-2-imidazolidinone), and heterocyclic compounds (such as pyridine), and water.

These solvents may be used alone or in combination of two or more kinds thereof.

Among these solvents, from the viewpoint that the surface state of the polarizer to be formed is satisfactory and the degree of alignment is further increased, it is preferable to use an organic solvent and more preferable to use a halogenated carbon compound or a ketone compound.

In a case where the composition contains a solvent, from the viewpoint that the surface state of the polarizer to be formed is satisfactory and the degree of alignment is further increased, the content of the solvent is preferably in a range of 70% to 99.5% by mass, more preferably in a range of 80% to 99% by mass, and still more preferably in a range of 85% to 98% by mass with respect to the total mass of the composition.

[Surfactant]

It is preferable that the composition contains a surfactant. In a case where the composition contains a surfactant, the smoothness of the coated surface is improved, the degree of alignment is improved, and cissing and unevenness are suppressed so that the in-plane uniformity is expected to be improved.

As the surfactant, a compound that allows the smectic liquid crystal compound to be horizontally aligned is preferable. As the compound that allows the smectic liquid crystal compound to be horizontally aligned, compounds (horizontal alignment agents) described in paragraphs [0253] to [0293] of JP2011-237513A can be used. Further, fluorine (meth)acrylate-based polymers described in paragraphs [0018] to [0043] of JP2007-272185A can also be used. Compounds other than such compounds may also be used as the surfactant.

In a case where the composition contains a surfactant, from the viewpoint that the surface state of the polarizer to be formed is satisfactory and the degree of alignment is further increased, the content of the surfactant is preferably in a range of 0.001 to 5 parts by mass and more preferably in a range of 0.01 to 3 parts by mass with respect to 100 parts by mass which is the total amount of the smectic liquid crystal compound, the monofunctional compound, and the dichroic material in the composition.

[Polymerization Initiator]

From the viewpoint that the surface state of the polarizer to be formed is satisfactory and the degree of alignment is further increased, it is preferable that the composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), a combination of acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the composition contains a polymerization initiator, from the viewpoint that the surface state of the polarizer to be formed is satisfactory and the degree of alignment is further increased, the content of the polymerization initiator is preferably in a range of 0.01 to 30 parts by mass and more preferably in a range of 0.1 to 15 parts by mass with respect to 100 parts by mass which is the total amount of the smectic liquid crystal compound, the monofunctional compound, and the dichroic material in the composition.

[Polarizer]

The polarizer is a polarizer formed of the above-described composition.

[Method of Producing Polarizer]

A method of producing the polarizer is not particularly limited, but a method including a step of coating an alignment film with the above-described composition to form a coating film (hereinafter, also referred to as a "coating film forming step") and a step of aligning a liquid crystal component contained in the coating film (hereinafter, also referred to as an "aligning step") in this order (hereinafter, also referred to as the "present production method") is preferable.

Further, the liquid crystal component is not only the smectic liquid crystal compound described above, but also a monofunctional compound having liquid crystal properties and a dichroic material having liquid crystal properties in a case where the monofunctional compound or the dichroic material has liquid crystal properties.

Hereinafter, each step will be described.

<Coating Film Forming Step>

The coating film forming step is a step of coating the alignment film with the above-described composition to form a coating film. The liquid crystal compound in the coating film is horizontally aligned due to an interaction between the alignment film and an interface improver (in a case where the composition contains an interface improver).

By using a composition containing the above-described solvent or a composition that is formed into a liquid material such as a melt by being heated, the alignment film is easily coated with the composition.

Examples of the method of coating the alignment film with the composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

The alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, from the viewpoint of easily controlling the pre-tilt angle of the alignment film, an alignment film formed by the rubbing treatment is preferable. Further, from the viewpoint of the uniformity of alignment, a photo-alignment film formed by irradiation with light is preferable.

(1) Rubbing Treatment Alignment Film

A polymer material used for the alignment film formed by the rubbing treatment is described in multiple documents, and a plurality of commercially available products can be used. Among these, polyvinyl alcohol, polyimide, or derivatives thereof are preferable. As the alignment film, the description on page 43, line 24 to page 49, line 8 of WO2001/088574A can be referred to.

The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. Preferred examples of the photo-alignment material include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, photocrosslinkable polyamides, or photocrosslinkable esters are preferable.

The photo-alignment film formed of the above-described material is irradiated with linearly polarized light or non-polarized light to produce a photo-alignment film.

In the present specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

The light source used for irradiation with light may be a known light source, and examples thereof include lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a member such as a wavelength conversion element.

In a case where light to be applied is linearly polarized light, a method of applying light vertically or obliquely to the surface of the alignment film from the upper surface or the rear surface of the alignment film is employed. The incidence angle of light varies depending on the photo-alignment material, but is preferably in a range of 0° to 90° (vertical) and preferably in a range of 40° to 90°.

In a case where light to be applied is non-polarized light, the alignment film is irradiated with non-polarized light obliquely. The incidence angle is preferably in a range of 10° to 80°, more preferably in a range of 20° to 60°, and still more preferably in a range of 300 to 500.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the liquid crystal component contained in the coating film. In this manner, a liquid crystal phase is obtained.

The aligning step may include a drying treatment. By performing the drying treatment, components such as a solvent can be removed from the coating film. The drying treatment may be performed according to a method of allowing the coating film to stand at room temperature for a predetermined time (for example, natural drying) or a method of heating the coating film and/or blowing air to the coating film.

Here, the liquid crystal component contained in the above-described composition may be aligned by the coating film forming step or the drying treatment described above. For example, in an embodiment in which the composition is prepared as a coating solution containing a solvent, a coating film having light absorption anisotropy (that is, a polarizer) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. In a case where the transition temperature is 10° C. or higher, a cooling treatment for lowering the temperature to a temperature range in which a liquid crystal phase is exhibited is not necessary. Further, in a case where the transition temperature is 250° C. or lower, a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the polarizer.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The polarizer can be obtained by performing the above-described steps.

In the present embodiment, examples of the method of aligning the liquid crystal component contained in the coating film include a drying treatment and a heat treatment, but the method is not limited thereto, and the liquid crystal component can be aligned by a known alignment treatment.

<Other Steps>

The present production method described below may include a step of curing the polarizer after the aligning step (hereinafter, also referred to as a “curing step”).

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate includes a base material, an alignment film provided on the base material, and the above-described polarizer provided on the alignment film.

Further, the laminate may also include λ/4 plate on the polarizer.

Further, the laminate may include a barrier layer between the polarizer and the λ/4 plate.

Hereinafter, each layer constituting the laminate will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence of polycarbonate or polysulfone which has been known in the related art, a polymer with the exhibiting property which has been degraded by modifying the molecules described in WO2000/026705A can be used.

[Alignment Film]

The alignment film is as described above, and thus the description thereof will not be repeated.

[Polarizer]

The polarizer is as described above, and thus the description thereof will not be repeated.

[λ/4 Plate]

A "?λ/4 plate" is a plate having a λ/4 function, for example, a function of converting linearly polarized light having a specific wavelength into circularly polarized light (or converting circularly polarized light into linearly polarized light).

Examples of a form in which a λ/4 plate has a single-layer structure include a stretched polymer film and a phase difference film in which an optically anisotropic layer having a λ/4 function is provided on a support. Further, examples of a form in which a λ/4 plate has a multilayer structure include a broadband λ/4 plate obtained by laminating a λ/4 plate and a λ/2 plate.

The λ/4 plate and the polarizer may be provided by coming into contact with each other, or another layer may be provided between the λ/4 plate and the polarizer. Examples of such a layer include a pressure-sensitive adhesive layer or an adhesive layer for ensuring the adhesiveness, and a barrier layer.

[Barrier Layer]

In a case where the laminate comprises a barrier layer, the barrier layer is provided between the polarizer and the λ/4 plate. Further, in a case where a layer other than the barrier layer (for example, a pressure-sensitive adhesive layer or an adhesive layer) is provided between the polarizer and the λ/4 plate, the barrier layer can be provided, for example, between the polarizer and the layer other than the barrier layer.

The barrier layer is also referred to as a gas blocking layer (oxygen blocking layer) and has a function of protecting the polarizer from gas such as oxygen in the atmosphere, the moisture, or the compound contained in an adjacent layer.

As the barrier layer, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] of JP2005-169994A can be referred to.

Applications

The laminate can be used, for example, as a polarizer (polarizing plate).

In a case where the laminate does not include an optically anisotropic layer such as the λ/4 plate, the laminate can be used as a linear polarizing plate.

Meanwhile, in a case where the laminate includes the λ/4 plate, the laminate can be used as a circularly polarizing plate.

[Image Display Device]

The image display device has the above-described polarizer or the above-described laminate.

The display element used in the image display device is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, as the image display device, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As the liquid crystal display device which is an example of the image display device, a form of a liquid crystal display device including the above-described polarizer and a liquid crystal cell is preferably exemplified. Further, a liquid crystal display device including the above-described laminate (here, not including a λ/4 plate) and a liquid crystal cell is preferable.

Between the polarizing elements provided on both sides of the liquid crystal cell, it is preferable that the above-described laminate is used as a front-side polarizing element and more preferable that the above-described laminate is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents. In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H02-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As the organic EL display device which is an example of the image display device, a form of a display device including the above-described polarizer, a λ/4 plate, and an organic EL display panel in this order from the viewing side is exemplified.

A form of a display device including the above-described laminate including a λ/4 plate and an organic EL display panel in this order from the viewing side is preferable as the organic EL display device. In this case, the laminate is formed such that a base material, an alignment film, the polarizer, a barrier layer provided as necessary, and a λ/4 plate are disposed in this order from the viewing side.

Further, the organic EL display panel is a display panel formed using an organic EL element having an organic light-emitting layer (organic electroluminescence layer) sandwiched between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

[Preparation of Alignment Film]

A TAC base material (TG40, manufactured by Fujifilm Corporation) subjected to a saponification treatment and having a thickness of 40 μm was coated with an alignment film coating solution 1 having the following composition using a #17 wire bar.

Thereafter, the base material was dried with warm air at 110° C. for 2 minutes, thereby obtaining a polyvinyl alcohol (PVA) alignment film on the TAC base material.

Further, modified polyvinyl alcohol was added to the alignment film coating solution such that the concentration of solid contents was set to 4% by mass.

| Composition of alignment film coating solution | |
|---|---|
| Modified vinyl alcohol (PVA-1 shown below): | 2.00 parts by mass |
| Water: | 74.08 parts by mass |
| Methanol: | 23.86 parts by mass |
| Photopolymerization initiator (IRGACURE 2959, manufactured by BASF SE): | 0.06 parts by mass |

Modified polyvinyl alcohol

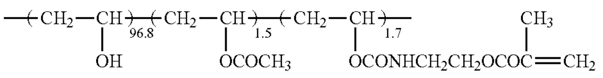

[Preparation of Polarizer]

The obtained alignment film was subjected to a rubbing treatment (roller rotation speed: 1000 rotations/spacer thickness of 1.8 mm, stage speed of 1.8 m/min) once and coated with the following composition 1 for forming a polarizer using a #7 wire bar, thereby forming a coating film.

Next, the coating film was heated at 140° C. for 30 seconds, and the coating film was cooled to 60° C.

Thereafter, the coating film was irradiated under an irradiation condition of an illuminance of 28 mW/cm$^2$ for 60 seconds using a high-pressure mercury lamp at 60° C., thereby preparing a polarizer 1 on the alignment film.

| Composition of composition 1 for forming polarizer | |
|---|---|
| Liquid crystal compound Al shown below: | 11.394 parts by mass |
| Monofunctional compound B1 shown below: | 1.587 parts by mass |
| Dichroic material Y1 shown below: | 0.361 parts by mass |
| Dichroic material M1 shown below: | 0.361 parts by mass |
| Dichroic material Cl shown below: | 0.361 parts by mass |
| Interface improver Fl shown below: | 0.072 parts by mass |
| Polymerization initiator Il (IRGACURE 369, manufactured by BASF SE): | 0.865 parts by mass |
| Tetrahydrofuran: | 59.500 parts by mass |
| Cyclopentanone: | 25.500 parts by mass |

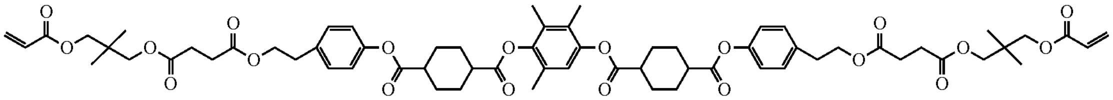

A1

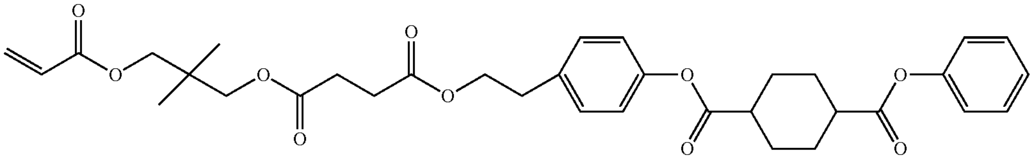

B1

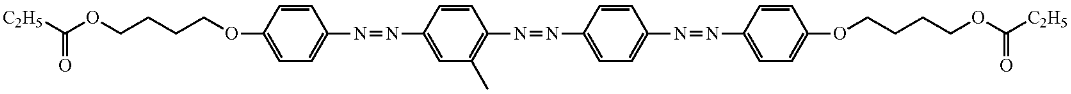

Y1

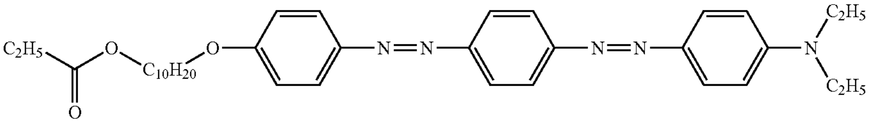

M1

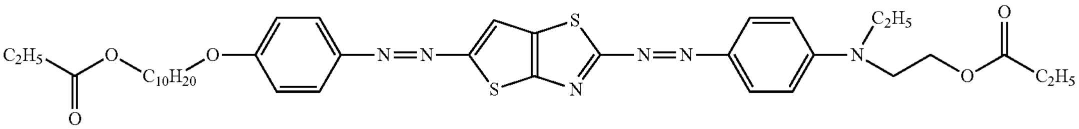

C1

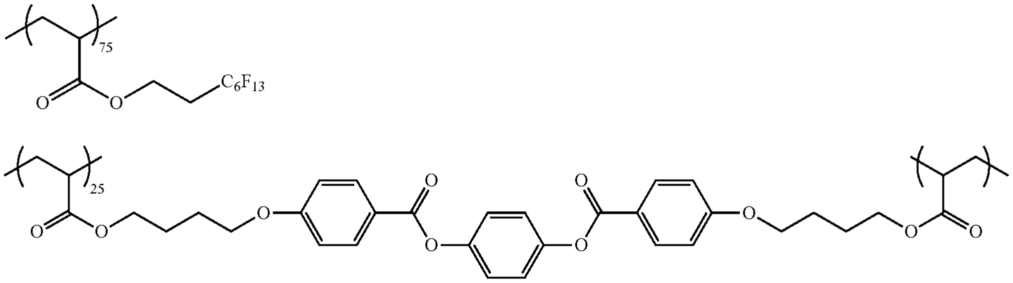

F1

Examples 2 to 10

Polarizers 2 to 10 were respectively prepared in the same manner as in Example 1 except that compositions 2 to 10 for forming a polarizer, obtained by changing the composition of the composition 1 for forming a polarizer to the composition listed in Table 1 were used.

Comparative Examples 1 to 4

Polarizers 1C to 4C were respectively prepared in the same manner as in Example 1 except that compositions 1C to 4C for forming a polarizer, obtained by changing the composition of the composition 1 for forming a polarizer to the composition listed in Table 1 were used.

[Evaluation]

[Surface State]

Each polarizer in the examples and the comparative examples was set on a sample table in a state in which a linear polarizer was inserted on a light source side of an optical microscope (product name, "ECLIPSE E600 POL", manufactured by Nikon Corporation). The set polarizer was observed with a microscope having an objective lens with a magnification of 10 times. Observation was performed on 10 arbitrarily selected sites for each polarizer, and the surface state of the polarizer was evaluated based on the following evaluation standards.

A: Defects were observed in 3 or less of the 10 observed sites.

B: Defects were observed in 4 to 8 of the 10 observed sites.

C: Defects were observed in 9 or more of the 10 observations.

Further, it can be said that the number of domains with a strong contrast decreases and the number of domains with a weak contrast increases as the number of sites where defects are observed decreases.

[Degree of Alignment]

Each polarizer in the examples and the comparative examples was set on a sample table in a state in which a linear polarizer was inserted on a light source side of an optical microscope (product name, "ECLIPSE E600 POL", manufactured by Nikon Corporation). The absorbance of each polarizer in the wavelength range of 380 to 780 nm was measured at a pitch of 1 nm using a multi-channel spectroscope (product name, "QE65000", manufactured by Ocean Optics, Inc.), and the degree of alignment of each polarizer in a wavelength range of 400 to 700 nm was calculated by the following equation. The results are listed in Table 1.

$$\text{Degree of alignment: } S=((Az0/Ay0)-1)/((Az0/Ay0)+2)$$

Az0: Absorbance of dye film with respect to polarized light in absorption axis direction Ay0: Absorbance of dye film with respect to polarized light in polarization axis direction In the equation described above, "Az0" represents the absorbance of the polarizer with respect to polarized light in the absorption axis direction, and "Ay0" represents the absorbance of the polarizer with respect to polarized light in the polarization axis direction.

TABLE 3

| | Composition for forming polarizer | | | | | | | | | | | | | | |
|---|---|---|---|---|---|---|---|---|---|---|---|---|---|---|---|
| | Smectic liquid crystal compound | | | Monofunctional compound | | | | Dichroic material | | Dichroic material | | Dichroic material | | Surfactant | |
| | Type | NA | Parts by mass | Type | NB | Parts by mass | Ratio NB/NA | Type | Parts by mass | Type | Parts by mass | Type | Parts by mass | Type | Parts by mass |
| Example 1 | A1 | 56 | 11.394 | B1 | 30 | 1.587 | 0.536 | Y1 | 0.361 | M1 | 0.361 | C1 | 0.361 | F1 | 0.072 |
| Example 2 | A1 | 56 | 11.394 | B2 | 22 | 1.587 | 0.393 | Y1 | 0.361 | M1 | 0.361 | C1 | 0.361 | F1 | 0.072 |
| Example 3 | A1 | 56 | 11.394 | B3 | 30 | 1.587 | 0.536 | Y1 | 0.361 | M1 | 0.361 | C1 | 0.361 | F1 | 0.072 |
| Example 4 | A1 | 56 | 10.385 | B1 | 30 | 2.596 | 0.536 | Y1 | 0.361 | M1 | 0.361 | C1 | 0.361 | F1 | 0.072 |
| Example 5 | A2 | 36 | 14.528 | B4 | 19 | 1.417 | 0.528 | Y2 | 0.425 | M2 | 0.354 | C2 | 0.390 | F1 | 0.089 |
| Example 6 | A2 | 36 | 14.528 | B5 | 21 | 1.417 | 0.583 | Y2 | 0.425 | M2 | 0.354 | C2 | 0.390 | F1 | 0.089 |
| Example 7 | A3 | 48 | 15.851 | B6 | 24 | 1.761 | 0.500 | Y2 | 0.431 | M2 | 0.431 | C2 | 0.431 | F1 | 0.117 |
| Example 8 | A3 | 48 | 15.851 | B7 | 24 | 1.761 | 0.500 | Y2 | 0.431 | M2 | 0.431 | C2 | 0.431 | F1 | 0.117 |
| Example 9 | A3 | 48 | 15.851 | B8 | 28 | 1.761 | 0.583 | Y2 | 0.431 | M2 | 0.431 | C2 | 0.431 | F1 | 0.117 |
| Example 10 | A3 | 48 | 15.851 | B9 | 24 | 1.761 | 0.500 | Y2 | 0.431 | M2 | 0.431 | C2 | 0.431 | F1 | 0.117 |
| Comparative example 1 | A1 | 56 | 11.394 | B10 | 18 | 1.587 | 0.321 | Y1 | 0.361 | M1 | 0.361 | C1 | 0.361 | F1 | 0.072 |
| Comparative example 2 | A2 | 36 | 14.528 | B11 | 25 | 1.417 | 0.694 | Y2 | 0.425 | M2 | 0.354 | C2 | 0.390 | F1 | 0.089 |
| Comparative example 3 | A3 | 48 | 15.851 | B13 | 36 | 1.761 | 0.750 | Y2 | 0.431 | M2 | 0.431 | C2 | 0.431 | F1 | 0.117 |
| Comparative example 4 | A3 | 48 | 15.851 | B12 | 39 | 1.761 | 0.813 | Y2 | 0.431 | M2 | 0.431 | C2 | 0.431 | F1 | 0.117 |

| | Composition for forming polarizer | | | | Evaluation of polarizer | |
|---|---|---|---|---|---|---|
| | Polymerization initiator | | Tetrahydrofuran | Cyclopentanone | | |
| | Type | Parts by mass | Parts by mass | Parts by mass | Surface state | Degree of alignment |
| Example 1 | I1 | 0.865 | 59.500 | 25.500 | A | 0.91 |
| Example 2 | I1 | 0.865 | 59.500 | 25.500 | B | 0.89 |
| Example 3 | I1 | 0.865 | 59.500 | 25.500 | B | 0.89 |
| Example 4 | I1 | 0.865 | 59.500 | 25.500 | B | 0.87 |
| Example 5 | I1 | 0.797 | 57.400 | 24.600 | A | 0.92 |

TABLE 3-continued

| | | | | | | |
|---|---|---|---|---|---|---|
| Example 6 | I1 | 0.797 | 57.400 | 24.600 | B | 0.91 |
| Example 7 | I1 | 0.978 | 56.000 | 24.000 | A | 0.92 |
| Example 8 | I1 | 0.978 | 56.000 | 24.000 | A | 0.92 |
| Example 9 | I1 | 0.978 | 56.000 | 24.000 | B | 0.91 |
| Example 10 | I1 | 0.978 | 56.000 | 24.000 | B | 0.90 |
| Comparative example 1 | I1 | 0.865 | 59.500 | 25.500 | C | 0.87 |
| Comparative example 2 | I1 | 0.797 | 57.400 | 24.600 | C | 0.89 |
| Comparative example 3 | I1 | 0.978 | 56.000 | 24.000 | C | 0.89 |
| Comparative example 4 | I1 | 0.978 | 56.000 | 24.000 | C | 0.89 |

The structures of the liquid crystal compounds, the monofunctional compounds, and the dichroic materials contained in the compositions 2 to 11 and 1C to 4C for forming a polarizer listed in Table 1 are shown below.

A2

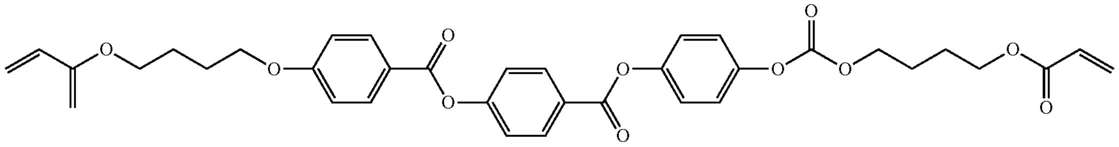

A3

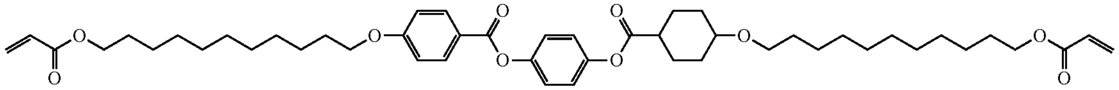

B1

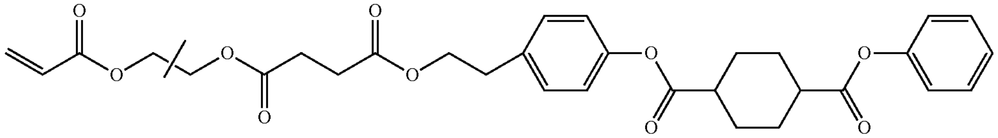

B2

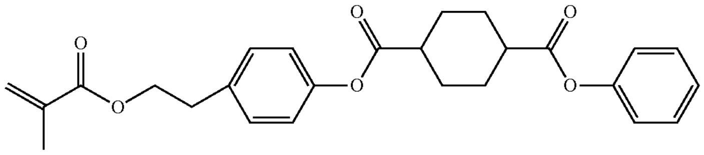

B3

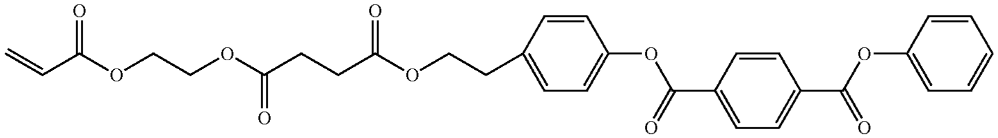

B4

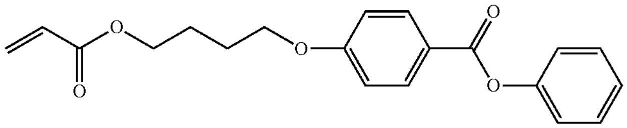

B5

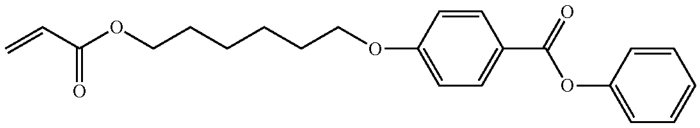

B6

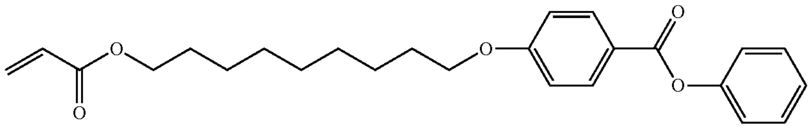

-continued

B7

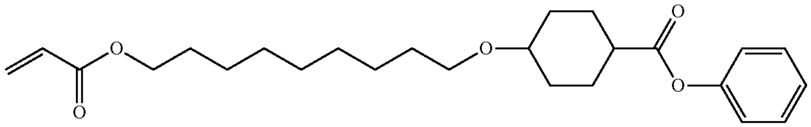

B8

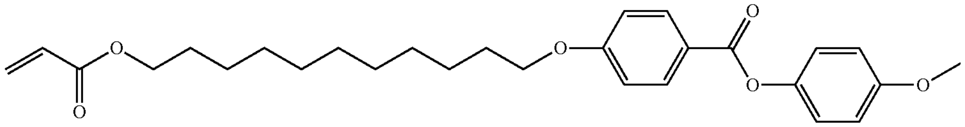

B9

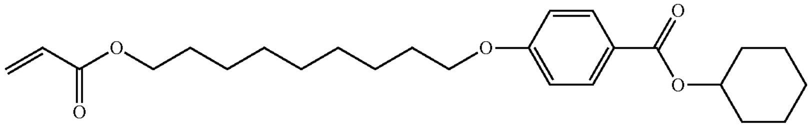

B10

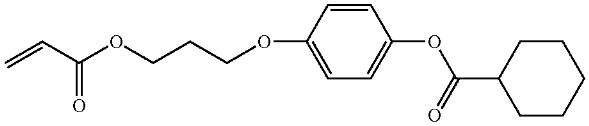

B11

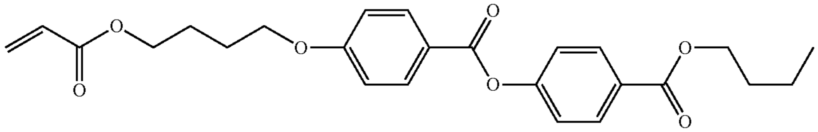

B12

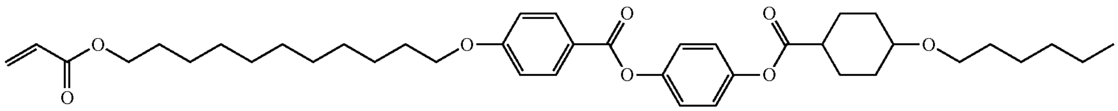

B13

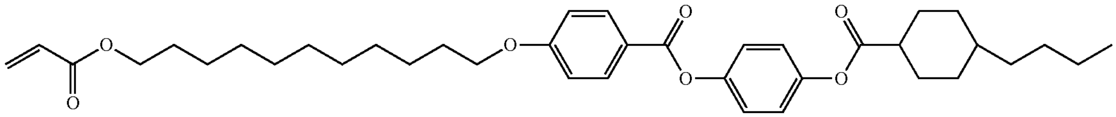

Y2

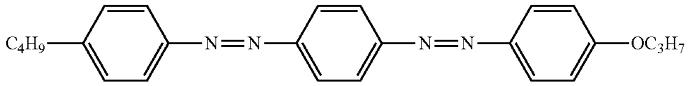

M2

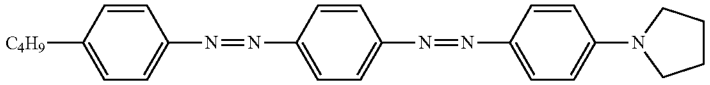

C2

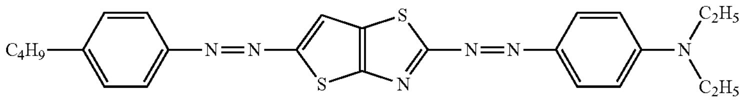

As shown in the results listed in Table 1, it was confirmed that the surface state of the polarizer to be formed is more excellent in a case where the number of atoms NA of the smectic liquid crystal compound and the number of atoms NB of the monofunctional compound satisfy Expression (1), in the composition for forming a polarizer which contains a smectic liquid crystal compound having two or more rings and two polymerizable groups, a monofunctional compound having two or more rings and one polymerizable group, and a dichroic material.

Further, it was confirmed that the surface state of the polarizer to be formed is more excellent in a case where the number of atoms NA of the smectic liquid crystal compound and the number of atoms NB of the monofunctional compound satisfy Expression (2) (comparison between Example 1 and Example 2, comparison between Example 5 and Example 6, and comparison between Example 7, Example 8, and Example 9).

Further, it was confirmed that the surface state of the polarizer to be formed is more excellent in a case where the arrangement of rings selected from the group consisting of an aromatic ring and an alicyclic ring contained in the monofunctional compound is the same as at least a part of the arrangement of rings selected from the group consisting of an aromatic ring and an alicyclic ring contained in the smectic liquid crystal compound (comparison between Example 1 and Example 3 and comparison between Example 7, Example 8, and Example 10).

What is claimed is:

1. A composition for forming a polarizer comprising:

a polymerizable liquid crystal compound represented by formula (A-1) which exhibits a liquid crystal state of a smectic phase;

a monofunctional polymerizable compound represented by Formula (B-1) which has one polymerizable group; and a dichroic material, wherein the number of atoms NA of the polymerizable liquid crystal compound represented by formula (A-1) and the number of atoms NB of the monofunctional polymerizable compound represented by Formula (B-1) satisfy Expression (2), wherein the content of the monofunctional polymerizable compound is in a range of 1 to 30 parts by mass in a case where the total mass of the solid content of the composition is set to 100 parts by mass, $$0.40 \leq NB/NA \leq 0.55; \quad (2)$$

wherein the monofunctional polymerizable compound represented by Formula (B-1) is:

$$Q^3\text{-}V^3\text{-}SP^3\text{-}X^3\text{-}(Mb\text{-}Lb)_{nb}\text{-}Tb \quad (B\text{-}1)$$

wherein in Formula (B-1), $Q^3$ represents a polymerizable group, $V^3$ and $X^3$ each independently represent a single bond or a divalent linking group, $SP^3$ represents a divalent spacer group, Mb represents an aromatic ring or an alicyclic ring which may have a substituent, where a plurality of Mbs may be the same as or different from each other, Lb represents a divalent linking group selected from the group consisting of —O—, $—(CF_2)_g—$, $—Si(CH_3)_2—$, $—(Si(CH_3)_2O)_g—$, $—(OSi(CH_3)_2)_g—$ (g represents an integer of 1 to 10), —N(Z)—, —C(Z)=C(Z')—, —C(Z)=N—, —N=C(Z)—, $—C(Z)_2—C(Z')_2—$, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, —C(O)S—, and a group obtained by combining two or more of these groups, where a plurality of Lbs may be the same as or different from each other, nb represents an integer of 2 to 5, and Tb represents a hydrogen atom or a monovalent substituent;

wherein the monofunctional polymerizable compound represented by Formula (B-1) has a terminal atom located at a terminal end of $Q^3$;

wherein the monofunctional polymerizable compound represented by Formula (B-1) has a terminal atom located at a terminal end of Tb;

wherein the terminal atom of $Q^3$ is connected to the terminal atom of Tb by atoms bonded together between the terminal atom of $Q^3$ and the terminal atom of Tb;

wherein NB is a numerical value determined for the monofunctional polymerizable compound represented by Formula (B-1) is equal to the number of atoms bonded together between the terminal atom of $Q^3$ and the terminal atom of Tb of the monofunctional polymerizable compound, including the terminal atom of $Q^3$ and the terminal atom of Tb;

wherein the polymerizable liquid crystal compound represented by Formula (A-1) is:

$$Q^1\text{-}V^1\text{-}SP^1\text{-}X^1\text{-}(Ma\text{-}La)_{na}\text{-}X^2\text{-}SP^2\text{-}V^2\text{-}Q^2 \quad (A\text{-}1)$$

wherein:

$Q^1$ and $Q^2$ each independently represent a polymerizable group, $V^1$, $V^2$, $X^1$, and $X^2$ each independently represent a single bond or a divalent linking group, $SP^1$ and $SP^2$ each independently represent a divalent spacer group, Ma represents an aromatic ring or an alicyclic ring which may have a substituent, where a plurality of Mas may be the same as or different from each other, La represents a single bond or a divalent linking group, where a plurality of La may be the same as or different from each other, and na represents an integer of 2 to 10;

wherein the polymerizable liquid crystal compound represented by Formula (A-1) has a terminal atom located at a terminal end of $Q^1$;

wherein the polymerizable liquid crystal compound represented by Formula (A-1) has a terminal atom located at a terminal end of $Q^2$;

wherein the terminal atom of $Q^1$ is connected to the terminal atom of $Q^2$ by atoms bonded together between the terminal atom of $Q^1$ and the terminal atom of $Q^2$; and wherein NA is a numerical value determined for the polymerizable liquid crystal compound represented by Formula (A-1) is equal to the number of atoms bonded together between the terminal atom of $Q^1$ and the terminal atom of $Q^2$ of the polymerizable liquid crystal compound represented by Formula (A-1), including the terminal atom of $Q^1$ and the terminal atom of $Q^2$.

2. A polarizer which is formed of the composition for forming a polarizer according to claim 1.

3. A laminate comprising:

a base material;

an alignment film provided on the base material; and the polarizer according to claim 2, provided on the alignment film.

4. An image display device comprising:

the polarizer according to claim 2.

5. An image display device comprising:

the laminate according to claim 3.

6. A polarizer which is formed of the composition for forming a polarizer according to claim 1.

7. A laminate comprising:

a base material;

an alignment film provided on the base material; and the polarizer according to claim 6, provided on the alignment film.

8. An image display device comprising:
the polarizer according to claim 6.

* * * * *